United States Patent
Hamdane et al.

(10) Patent No.: US 9,509,322 B2
(45) Date of Patent: Nov. 29, 2016

(54) LOW SPURIOUS SYNTHESIZER CIRCUIT AND METHOD

(71) Applicant: NANOWAVE TECHNOLOGIES INC., Etobicoke (CA)

(72) Inventors: Walid Hamdane, Ottawa (CA); Charles William Tremlett Nicholls, Ottawa (CA)

(73) Assignee: Nanowave Technologies Inc., Etobicoke (CA)

( * ) Notice: Subject to any disclaimer, the term of this patent is extended or adjusted under 35 U.S.C. 154(b) by 0 days.

(21) Appl. No.: 14/647,949

(22) PCT Filed: Nov. 29, 2012

(86) PCT No.: PCT/CA2012/050864
§ 371 (c)(1),
(2) Date: May 28, 2015

(87) PCT Pub. No.: WO2014/082155
PCT Pub. Date: Jun. 5, 2014

(65) Prior Publication Data
US 2015/0303929 A1    Oct. 22, 2015

(51) Int. Cl.
*H03B 21/00*    (2006.01)
*H03L 7/08*    (2006.01)
(Continued)

(52) U.S. Cl.
CPC ............... *H03L 7/085* (2013.01); *H03L 7/099* (2013.01); *H03L 7/18* (2013.01); *H03L 7/185* (2013.01); *H03L 7/23* (2013.01)

(58) Field of Classification Search
CPC ......... H03L 7/08; H03L 7/085; H03L 7/099; H03L 7/18; H03L 7/185; H03L 7/191; H03L 7/23; H03L 7/235
USPC ........ 327/105, 107, 147, 150, 156, 159, 551
See application file for complete search history.

(56) References Cited

U.S. PATENT DOCUMENTS

| 4,314,208 A | 2/1982 | Munday |
| 5,146,186 A | 9/1992 | Vella |

(Continued)

FOREIGN PATENT DOCUMENTS

| EP | 0471487 A1 | 2/1992 |
| EP | 0793348 A1 | 9/1997 |

(Continued)

OTHER PUBLICATIONS

International Patent Application No. PCT/CA2012/050864, International Search Report and Written Opinion dated Apr. 25, 2013.

(Continued)

*Primary Examiner* — William Hernandez
(74) *Attorney, Agent, or Firm* — Curtis B. Behmann; Borden Ladner Gervais LLP

(57) ABSTRACT

An offset phase locked loop synthesizer comprising: an input; an output; a voltage controlled oscillator (VCO), the VCO output coupled to the synthesizer output; a phase frequency detector having a reference input, a feed-back input, and an output; a mixer having a first mixer input coupled to the synthesizer input and a second mixer input coupled to the VCO output; a first divider for frequency dividing a signal by a first value and having an input coupled to the mixer output and an output coupled to the second input of the phase frequency detector; a second divider for frequency dividing a signal by a second value and having an input coupled to the synthesizer input and an output coupled to the reference input of the phase frequency detector; and a low pass filter coupled between the output of the phase frequency detector and the VCO input.

18 Claims, 23 Drawing Sheets

(51) Int. Cl.
*H03L 7/085* (2006.01)
*H03L 7/099* (2006.01)
*H03L 7/18* (2006.01)
*H03L 7/185* (2006.01)
*H03L 7/23* (2006.01)

(56) References Cited

U.S. PATENT DOCUMENTS 6,005,443 A * 12/1999 Damgaard .............. H03J 5/242
 331/14
6,150,890 A * 11/2000 Damgaard .............. H03J 5/242
 331/14
8,373,463 B1 * 2/2013 Chenakin ................ H03L 7/095
 327/147
2009/0267697 A1 10/2009 Gamliel
2009/0309665 A1 * 12/2009 Chenakin .................. H03L 7/16
 331/25
2012/0112806 A1 5/2012 Dayi

FOREIGN PATENT DOCUMENTS

EP 1624576 A1 2/2006
WO 2011128671 A1 10/2011

OTHER PUBLICATIONS

International Patent Application No. PCT/CA2012/050864, International Preliminary Report on Patentability dated Dec. 23, 2014.
Supplementary European Search Report for Application No. EP12889269, mailed on Jul. 4, 2016, 8 Pages.

* cited by examiner

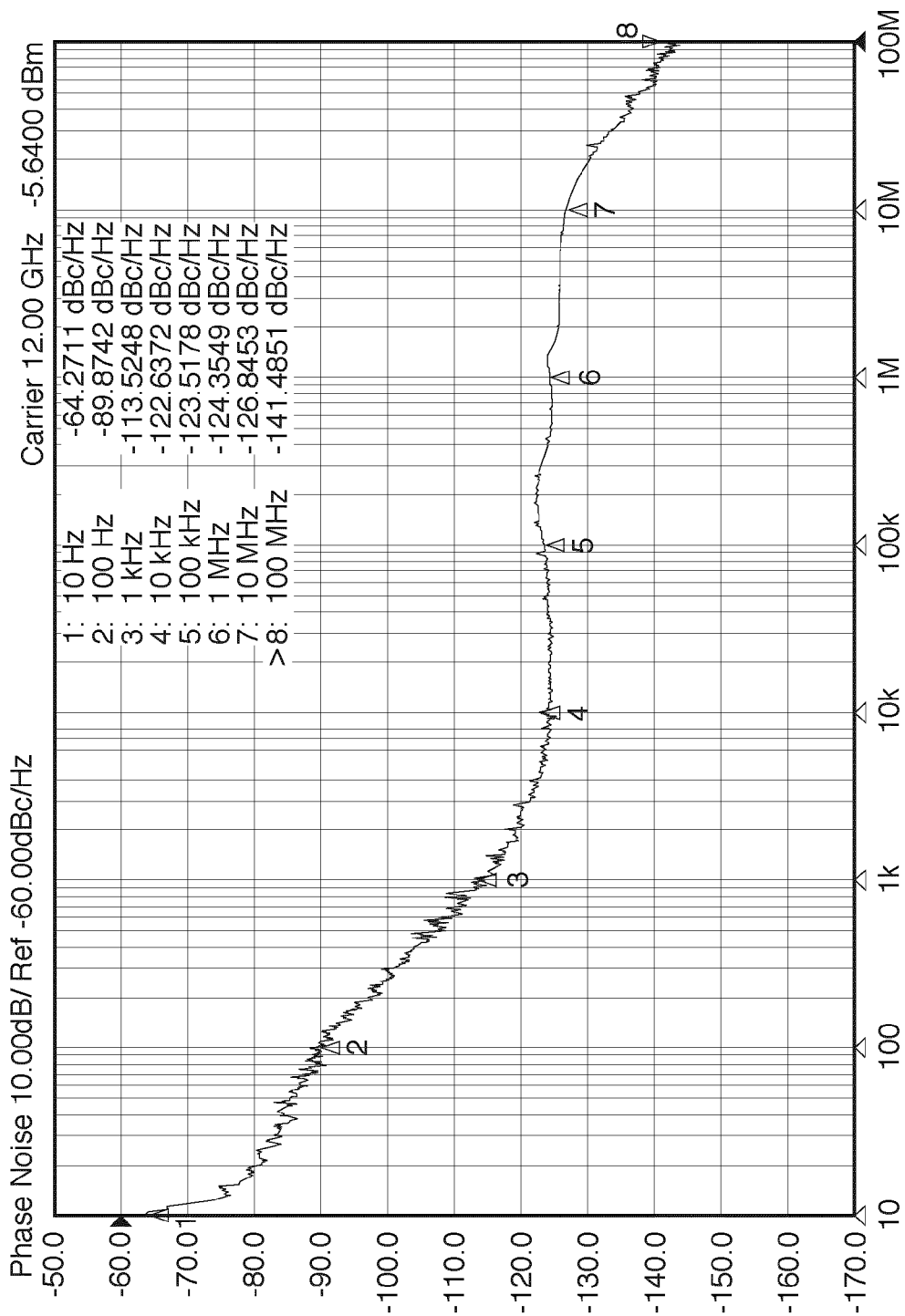

LOW SPURIOUS SYNTHESIZER CIRCUIT AND METHOD

CROSS-REFERENCE TO RELATED APPLICATIONS

This application is a U.S. National Entry of PCT Patent Application No. PCT/CA2012/050864 filed Nov. 29, 2012.

FIELD

The present disclosure relates generally to signal sources. More particularly, the present disclosure relates to offset loop frequency synthesizers.

BACKGROUND

Frequency synthesizers are often used to provide a signal at a particular frequency. Frequency synthesizers can include a Phase Locked Loop (PLL) circuit to lock onto an input signal and produce an output signal at a different frequency. Frequency synthesizers are used in a variety of applications including telecommunications and RADAR systems. Improvements in frequency synthesizers are desirable.

The above information is presented as background information only to assist with an understanding of the present disclosure. No determination has been made, and no assertion is made, as to whether any of the above might be applicable as prior art with regard to the present invention.

SUMMARY

In a first aspect, the present disclosure provides an offset phase locked loop synthesizer comprising: a synthesizer output, for providing an output signal; a voltage controlled oscillator (VCO) having a VCO input and a VCO output, the VCO output being coupled to the synthesizer output; a synthesizer input for receiving an offset signal; a phase frequency detector having a reference input for receiving a reference signal, a feed-back input for receiving a feed-back signal, and an output, the phase frequency detector configured to provide an output signal at the output based on a difference between the reference signal and the feed-back signal; a mixer having a first mixer input, a second mixer input, and a mixer output, the first mixer input coupled to the synthesizer input, the second mixer input coupled to an output of the VCO; a first divider having an input and an output, the input coupled to the mixer output and the output coupled to the second input of the phase frequency detector, the first frequency divider being configured to frequency divide a signal received at the first divider input by a first value; a second divider having an input coupled to the synthesizer input for receiving the offset signal and an output coupled to the reference input of the phase frequency detector, the second frequency divider being configured to frequency divide a signal received at the second divider input by a second value; and a low pass filter coupled between the output of the phase frequency detector and the VCO input.

In some embodiments, the offset phase locked loop synthesizer further comprises an offset signal generator for generating the offset signal. In some embodiments, the output of the offset signal generator is coupled to the synthesizer input.

In various embodiments, the offset signal generator comprises an adjustable frequency reference. In some embodiments, the adjustable frequency reference comprises the above-described offset phase locked loop or a fixed frequency offset circuit coupled to the synthesizer input of the offset phase locked loop of the offset signal generator.

In various embodiments, the adjustable frequency reference comprises a frequency adjustable phase locked loop, and in some embodiments further comprises a direct digital synthesizer (DDS) for generating a reference frequency signal for the phase locked loop.

In various embodiments, the adjustable frequency reference comprises a wide band DDS.

In some embodiments, the adjustable frequency reference comprises a narrowband phase locked microwave source, such as, for example, but not limited, to a dielectric resonator oscillator.

In various embodiments, the frequency of the output signal is adjustable by modification of the first value of the first frequency divider and the second value of the second frequency divider.

In various embodiments, the adjustable frequency reference comprises an optoelectronic oscillator.

In some embodiments, the adjustable frequency reference comprises a coarse tuned integer −N synthesizer.

In various embodiments, the frequency of the output signal is adjustable by modification of the first value of the first frequency divider and the second value of the second frequency divider.

In some embodiments, the first value is N and the second value is M; and wherein a frequency (Fo) of the output of the voltage controlled oscillator and a frequency (FREF) of the reference signal are related according to: FREF×(M+N)=Fo.

In various embodiments, for any reference signal frequency, the frequency of the output of the voltage controlled oscillator and the offset frequency are simultaneously an integer multiple of a frequency of the reference signal.

In some embodiments, the frequency of the offset signal is adjustable with a step size less than a 3 dB bandwidth of the low pass filter.

In some embodiments, the frequency of the output is controlled by changing the frequency of the offset signal frequency.

In various embodiments, the frequency of the output is controlled by changing the first divider value and the second divider value; and the offset frequency is held at a fixed value.

In a second aspect, the present disclosure provides a method of generating an output signal, the method comprising: receiving a reference signal; mixing the reference signal and the output signal to produce a mixed signal; frequency dividing the mixed signal by a factor N to produce a first frequency divided signal; frequency dividing the offset frequency signal by a factor M to produce a second frequency divided signal; detecting a phase and frequency difference between the first frequency divided signal and the second frequency divided signal; generating a control signal based on the detected phase and frequency difference and generating the output signal based on the detected difference, the output signal being an integer multiple of the reference signal;

In some embodiments, the frequency ($F_o$) of the output signal and a frequency ($F_{REF}$) of the reference signal are related according to: $F_{REF} \times (M+N) = F_o$.

In various embodiments, generating the output signal comprises low pass filtering the difference signal.

In some embodiments, generating the output signal comprises applying the control signal to the frequency control port of the output oscillator.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures, wherein:

FIGS. 14B to 14D are examples of measured phase noise in a frequency synthesizer according to FIG. 14A.

DETAILED DESCRIPTION

Figure 1:
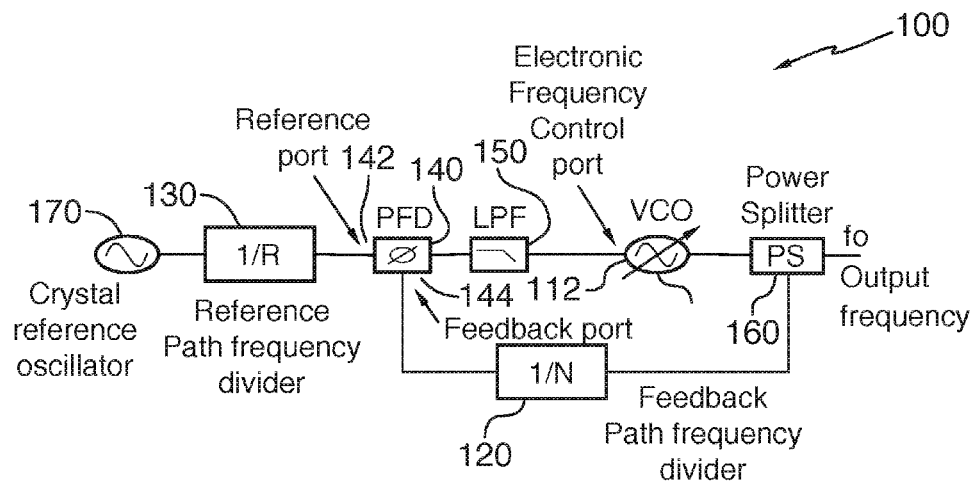
FIG. 1 is a block diagram of a known phase locked loop frequency synthesizer.

For simplicity and clarity of illustration, reference numerals may be repeated among the figures to indicate corresponding or analogous elements. Numerous details are set forth to provide an understanding of the examples described herein. The examples may be practiced without these details. In other instances, well-known methods, procedures, and components are not described in detail to avoid obscuring the examples described. The description is not to be considered as limited to the scope of the examples described herein.

Phase locked loops are used to impose the frequency stability of a frequency stable reference such as a crystal reference oscillator on a voltage controlled oscillator (VCO), operating at a frequency difference from the crystal frequency determined in some implementations by the value of a frequency divider placed in the phase locked loop feedback path.

Control of the frequency divider value enables the phase locked loop to operate as a frequency synthesizer to provide a multiplicity of output frequencies that are in some implementations an integer multiple of the reference frequency.

In the most basic implementation of the phase locked loop, (shown in FIG. 1), the VCO 110 frequency is passed through the feedback frequency divider 120 which reduces the VCO frequency by a factor 'N' to that of the comparison frequency, Fc. The reference frequency is passed through the reference frequency divider 130 which reduces the reference frequency by a factor 'R' to that of the comparison frequency. The reference frequency is generated by a crystal reference oscillator 170. The comparison frequency is the frequency at which the reference and divided VCO signals are compared in phase and frequency, the comparison frequency is often but not always the reference frequency. The reference and divided VCO signals are applied to the reference 142 and feedback 144 ports of the phase frequency detector 140, (PFD). The PFD 140 compares the reference and feedback signals in phase and frequency. The output of the PFD 140 is a series of correction signal pulses. The correction signal pulses from the PFD 140 occur at the comparison frequency. The correction pulses are integrated by a low pass filter 150 to generate a correction voltage which is fed to the electronic frequency control port 112 of the VCO 110. The low pass filter 150 also acts to suppress the comparison frequency ripple in the control signal. The correction signal adjusts the VCO 110 frequency so as to reduce the phase and frequency difference between the divided VCO feedback signal and the reference signal. FIG. 1 also shows a power splitter 160 that splits the output of VCO 110 and outputs it to the output of the frequency synthesizer 100 and to the input of feedback frequency divider 120.

When the system is phase locked, the VCO frequency is equal to the reference frequency multiplied by the feedback divider value. In the case, for example, that the VCO frequency is 1000 MHz and the crystal reference frequency is 100 MHz the feedback frequency divider N would be 10.

A second principle operation of the phase locked loop is to synthesize a multiplicity of frequencies. Frequency synthesis is achieved by changing the frequency divider present in the feedback path. In the previously mentioned example, if the frequency divider is increased in value from 10 to 11 then the VCO frequency will increase from 1000 MHz to 1100 MHz in order that the frequency at which the VCO and the crystal reference signals are compared in phase in the PFD remains 100 MHz.

The frequency synthesizer just described is limited in its frequency step size by the comparison frequency used. If for example the frequency step size required is 10 KHz and the reference frequency is 100 MHz the frequency divider 'R' present in the reference path will need to be increased from 1 to 10,000 and the frequency divider present in the feedback path will need to increase to 100,000. Under the aforementioned conditions, an integer change in the feedback divider will result in a 10 KHz change in the VCO frequency.

Figure 2:
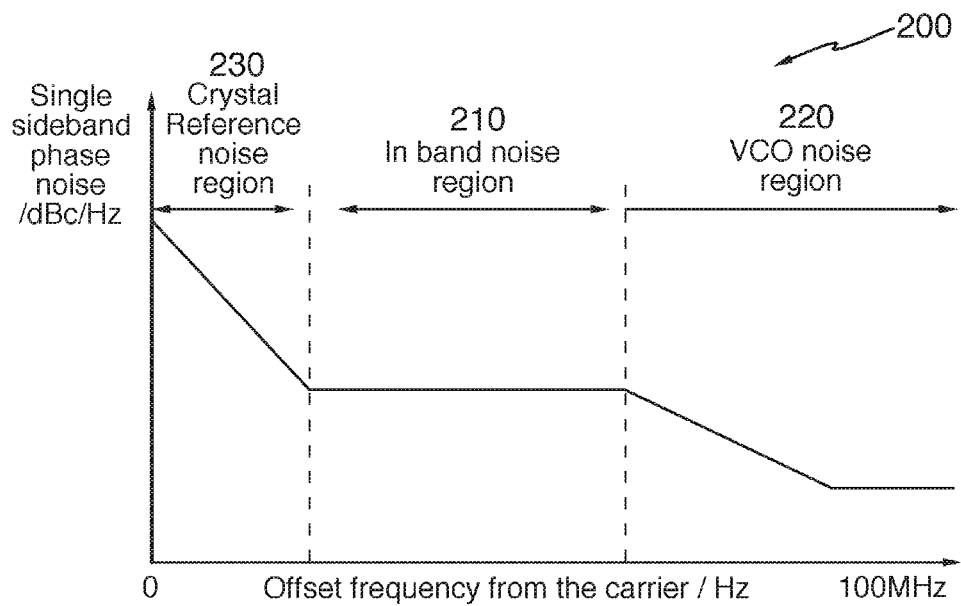
FIG. 2 is a graph of phase noise within the phase locked loop of FIG. 1.

The requirement for the phase locked loop frequency synthesizer to provide smaller frequency step sizes results in increasingly large values of the feedback divider value, 'N'. The impact of increased feedback divider values is increased phase noise within the low pass filter bandwidth. FIG. 2 illustrates a graph 200 showing three main sources of phase noise within the phase locked loop of FIG. 1.

Phase noise in the reference source signal applied to the PFD 140 is increased by a factor of $20 \log_{10}(N)$. Phase noise from the PFD 140 and frequency divider circuit 120 results in a figure of merit, (FOM) for the synthesizer. The FOM sets the in loop phase noise, termed in band noise (IBN), in accordance with the relationship FOM+$20 \log_{10}(N)$+$10 \log_{10}(F_c)$. The IBN is the plateau in region 210 of the phase noise graph 200 of FIG. 2. Outside the loop bandwidth the synthesizer, in region 220 of FIG. 2, phase noise is set by the free running VCO 110. Based on the phase noise transfer functions discussed it can be seen that optimal phase noise performance is achieved as 'N' is decreased towards unity, this objective however is in contradiction to the provision of small frequency step size. Crystal reference noise region 230 of graph 200 corresponds to the noise from the crystal reference oscillator scaled to the output of the synthesizer by $20 \log_{10}(N)$.

Figure 3:
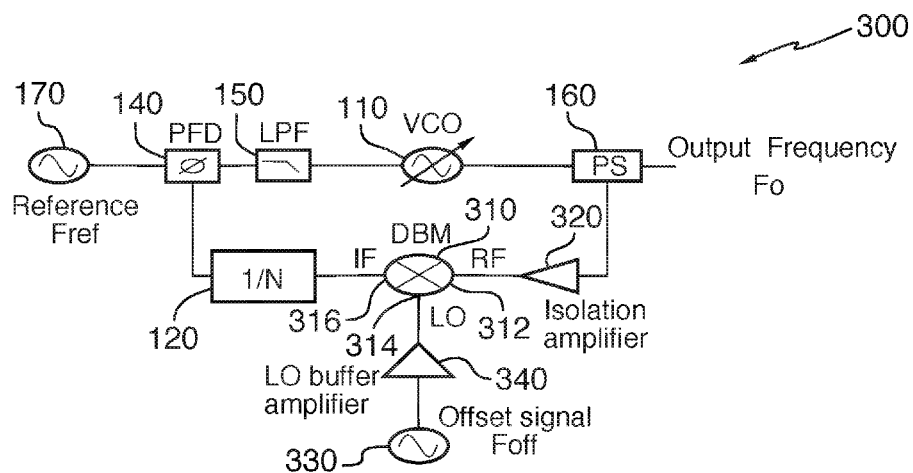
FIG. 3 is a block diagram of a known offset loop frequency synthesizer.

The conventional offset phase locked loop was introduced to reduce the 'N' value of the feedback divider through the introduction of a mixer in the feedback path of the phase locked loop. The implementation of the conventional offset phase locked loop is illustrated in FIG. 3.

The VCO feedback signal in the conventional offset phase locked loop is applied to the radio frequency (RF) port 312 of a double balanced mixer 310 placed in the feedback path. An isolation amplifier 320 is placed between the synthesizer output and the RF port 312 of the mixer 310 to prevent mixer frequency products leaking to the output of the synthesizer. An offset frequency is applied to the local oscillator (LO) port 314 of the mixer. The offset frequency signal ($F_{off}$) is generated by offset signal generator 330 and passed through LO buffer amplifier 340 before being applied to LO port 314. The sum and difference frequency of the RF and LO signals are output at the mixer intermediate frequency (IF) port 316. It should be noted that, in various embodiments, the RF and LO signals to the mixer 310 can be interchanged provided the drive levels to the mixer are respected.

The difference frequency of the mixer LO and RF frequencies is used as the feedback signal for the phase locked loop. The sum frequency of the LO and RF is suppressed at the IF port 316 with a low pass filter (not shown), in the case that the sum frequency exceeds the IF bandwidth of the mixer 310 a filter is not required.

The action of the mixer 310 is to reduce the VCO 110 frequency fed back to the frequency divider 120 that precedes the PFD 140 and consequently reduce the value of the required frequency divider 120. The operation of the mixer 310 is significantly different from a frequency divider from a noise stand point in that a frequency change in the VCO 110 applied at the RF port 312 of the mixer 310 is translated to the same frequency change at the IF port 316. Consequently, the VCO 110 frequency changes less to correct for the PFD 140 and divider 120 noise resulting in lower IBN in the resultant synthesizer. In the case in which the offset signal is set such that the difference frequency at the IF port 316 of the mixer 310 equals the comparison frequency the feedback divider 120 value 'N' is reduced to unity and the synthesizer 300 IBN is reduced to an optimal level set by the FOM which is dictated by the fundamental noise properties of the selected PFD 140 and the output frequency which is set by the specification of the design.

The low phase noise properties of the offset loop synthesizer have resulted in its use in high performance synthesizer systems. Frequency adjustment of the offset loop is achieved by adjustment of the offset frequency. Since the offset frequency is lower than the VCO 110 output frequency by at least the comparison frequency, the phase noise of the offset signal synthesizer 300 can be designed to be lower than that of the main offset loop so that the main loop phase noise floor is not degraded.

The aforementioned description illustrates the advantageous operation of the offset loop frequency synthesizer 300 that has led to its use in high performance synthesizers. Very rarely addressed with the offset loop architecture are the mechanisms by which spurious signals are generated in the offset loop which limit its application for broad band high performance frequency synthesis. Some embodiments disclosed herein address these limitations in a complete manner.

Spurious signals are non-harmonically related to the frequency synthesizer output. If for example a frequency synthesizer output was set at 10 GHz the first harmonic frequency would be at 20 GHz and a signal detected at the output of the frequency synthesizer at a frequency of 10.3 GHz would be classified as a spurious signal.

The key parameters of a signal source of phase noise and spurious signal level determine the sensitivity of the radio equipment into which the frequency synthesizer is integrated.

Figure 4:
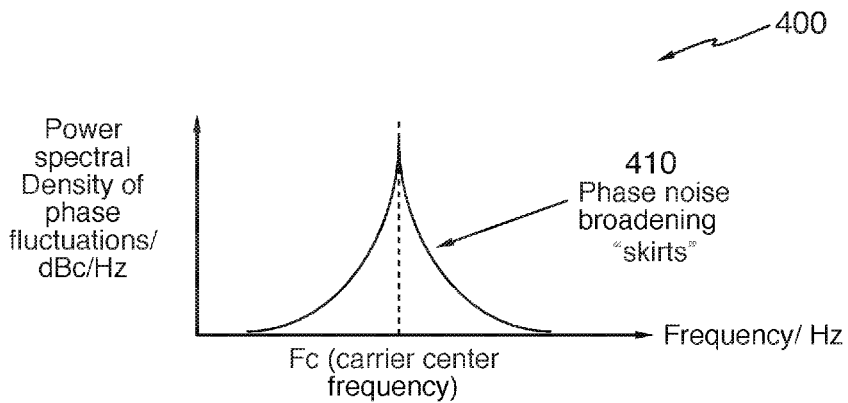
FIG. 4 is a graph of representative oscillator phase noise.

Phase noise results in a decaying carrier power spectral density of phase fluctuations at increasing offset frequencies from the carrier frequency. FIG. 4 is a graph of representative oscillator phase noise in synthesizers such as synthesizer 300 of FIG. 3. The resultant spectral broadening around the carrier center frequency $F_c$ is often described as the frequency domain signal having "skirts" 410.

Figure 5:
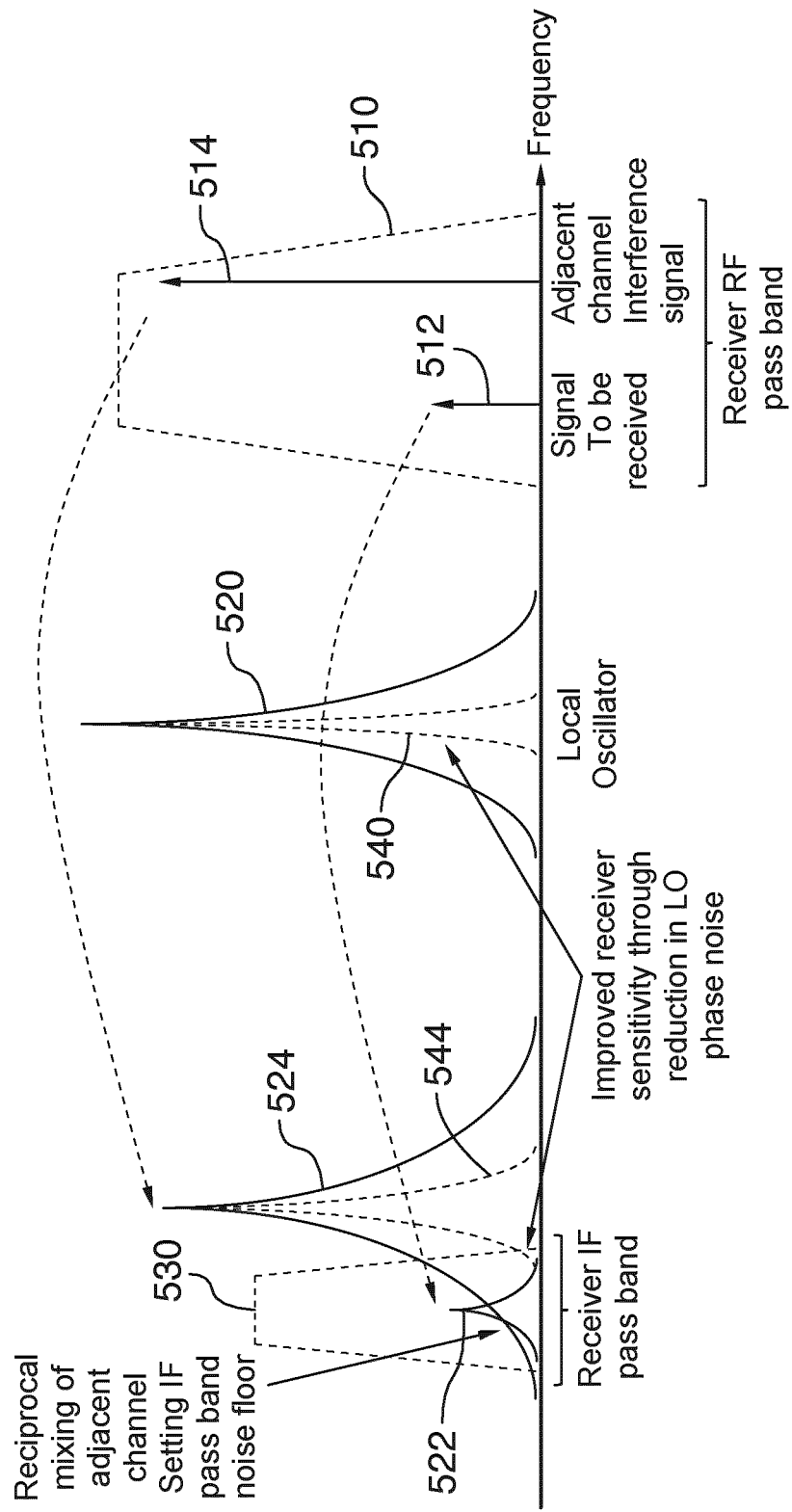
FIG. 5 is a diagram illustrating the effect of reciprocal mixing on receiver noise floor.

The presence of carrier power at frequency offsets from the carrier frequency results in reciprocal mixing. Reciprocal mixing occurs when the phase noise sidebands of the local oscillator down convert signals or noise outside the system RF pass band into the system IF pass band effectively setting the system receiver noise floor. In telecommunications systems specifications adjacent channel power is defined which when mixed in band by the local oscillator phase noise will set the receiver sensitivity, this effect is illustrated in FIG. 5. Low phase noise synthesizers are consequently a pre-requisite for telecommunications systems operating with narrow channel spacing.

FIG. 5 illustrates a receiver RF pass band 510 with a signal to be received 512 and an adjacent channel interference signal 514. The use of a first oscillator 520 produces signal 522 based on signal 512 and signal 524 based on signal 514. As can be seen in FIG. 5, there is interference between signals 524 and 522 in the receiver pass band 530. In contrast, for a second oscillator 540, which has narrower phase noise sidebands than oscillator 520, the signal 544 produced based on signal 514 does not enter the receiver IF pass band.

Figure 6A:
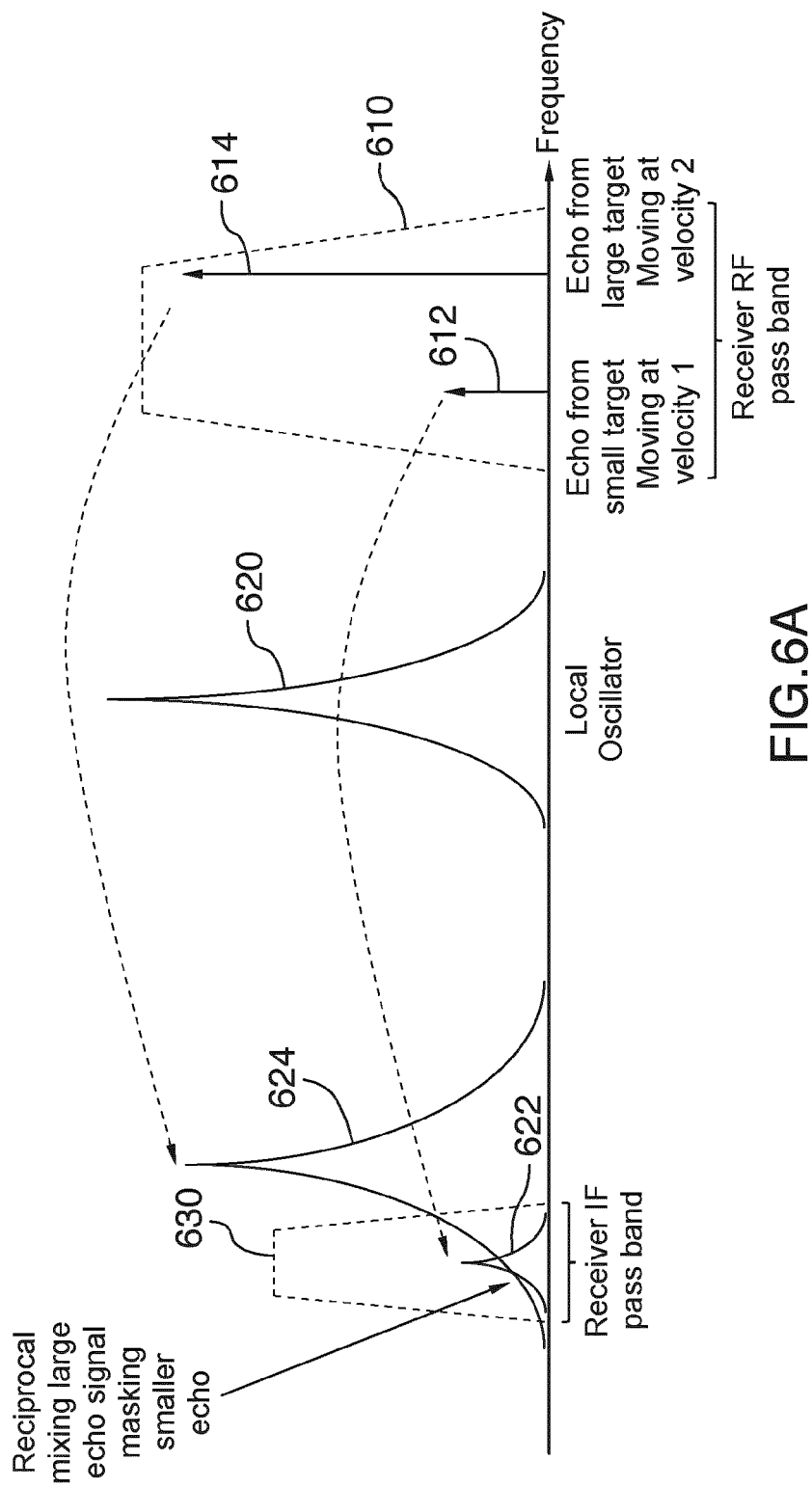
FIG. 6A is a diagram illustrating the effect of phase noise on RADAR signal detection.

FIG. 6A is a diagram illustrating the effect of phase noise on RADAR signal detection. FIG. 6A illustrates an echo 612 from a small target moving at a first velocity and an echo 614 from a large target moving at a second velocity in the receiver RF pass band 610. The use of local oscillator 620 results in signals 622 and 624, based on echoes 612 and 614 respectively, in the receiver IF pass band 630. Given that local oscillator 620 has wide phase noise skirts, reciprocal mixing occurs and signal 624 from the echo of the large target masks signal 622 from the echo of the small target.

Spurious signals are problematic in that they can occur within the system pass band and as such can cause degradation of the system performance. Phase noise spurious occurring within the system pass band often must be reduced at the frequency synthesizer as the pass band characteristics of the overall system often must be maintained in order to meet system performance targets.

Figure 6B:
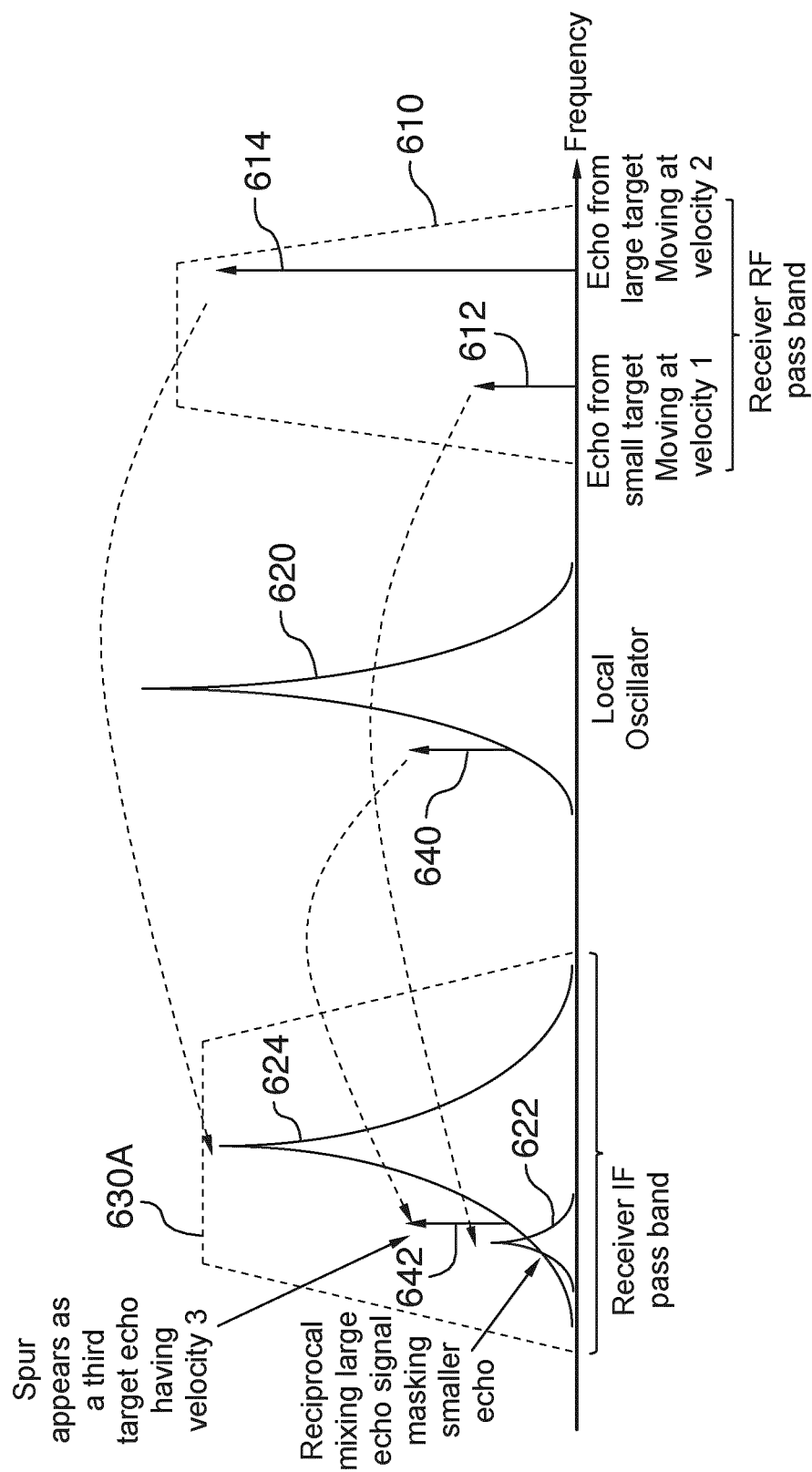
FIG. 6B is a diagram illustrating the effect of spurious on RADAR signal detection.

Spurious signals and phase noise degrade the performance of radio frequency transceiver systems used in RADAR. In RADAR systems reciprocal mixing of the local oscillator phase noise can result in masking of target echoes setting the minimum detectable signal and consequently the RADAR range. A spurious signal present in the receiver local oscillator will appear to the receiver electronics as a false target echo at a new frequency within the IF pass band. The RADAR system determines the radial velocity of the target based on the echo frequency consequently a spur in the local oscillator that appears in the RADAR IF pass band could be considered a new target. Consequently, the spurious free dynamic range is a determining factor in the unambiguous range and velocity determination of a RADAR system, this effect is illustrated in FIG. 6B. FIG. 6B illustrates spur 640 resulting in signal 642 within the receiver IF pass band 630a. Signal 642 would appear as a target moving at third velocity.

Spurious signals present in the RADAR and Telecommunications transmitters must also be controlled in order to meet the strict system emissions requirements. Modern RADAR and Telecommunications systems performance and operation are reliant on low phase noise and low spurious signal sources in order to meet emissions requirements and system performance objectives. It will now be shown how, although the conventional offset loop frequency synthesizer in part addresses low phase noise operation it is limited with respect to the operational bandwidth available for low spurious and low phase noise operation required for frequency agile radio systems. Various embodiments disclosed herein address these limitations providing a broadband, low phase noise and low spurious frequency synthesizer.

The conventional offset loop frequency synthesizer suffers from high spurious output levels at particular offset frequencies. The offset frequencies at which high spurious levels occur are when the difference between the offset frequency and an integer multiple of the comparison frequency falls within the phase locked loop bandwidth. In the special case that the offset frequency is exactly an integer multiple of the reference frequency then the spurious occur at the comparison frequency and consequently do not appear at the synthesizer output as they are masked by the desired output frequency. When the reference frequency is an exact integer multiple of the synthesizer output frequency the synthesizer will be said to be at an "integer boundary". Spurious resulting from operation close to an integer boundary will be termed "integer boundary spurs".

Figure 7A:
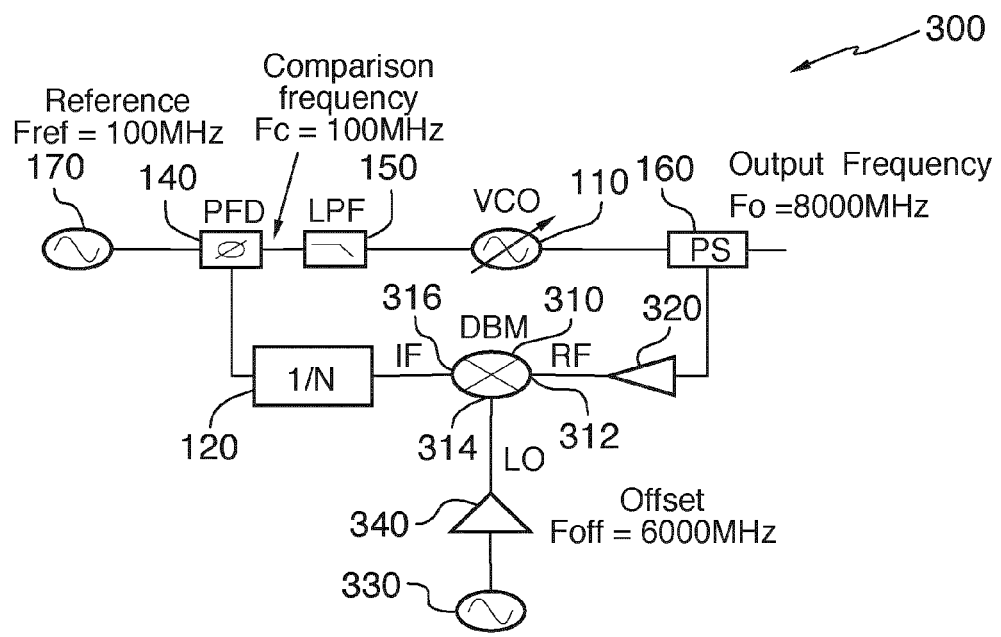
FIG. 7A is block diagram of a synthesizer operating at an integer boundary.
Figure 7B:
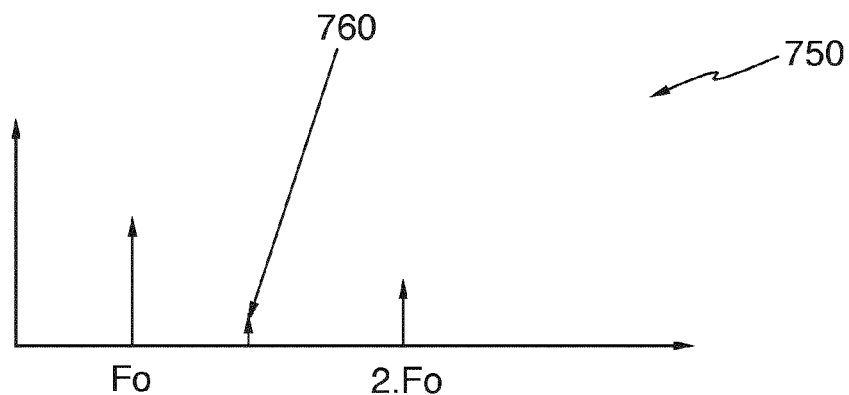
FIG. 7B is a graph of the power spectrum of the output of the mixer of the synthesizer of FIG. 7A.

To better understand the spurious mechanism present in the conventional offset phase locked loop and as such understand the improvement achieved by some embodiments disclosed herein, a synthesizer 300 having an output frequency of 8 GHz will be analyzed. The synthesizer parameters are illustrated in FIG. 7A. In the example case the 8 GHz VCO signal is mixed down to a 2 GHz IF signal using a 6 GHz offset signal applied at the LO port 314 of the mixer 310. The 2 GHz IF signal is then further frequency divided by a factor of 20 to reach the comparison frequency of 100 MHz. As illustrated in graph 750 of FIG. 7B, because the comparison frequency signal $F_c$ is an integer multiple of the offset frequency $F_{off}$ and the RF frequency all mixing products fall at integer multiples of the comparison frequency $F_c$ and as such no spurs are observed beyond the comparison frequency spur 760, which is suppressed by the loop filter. The synthesizer is operating at an integer boundary.

Figure 8A:
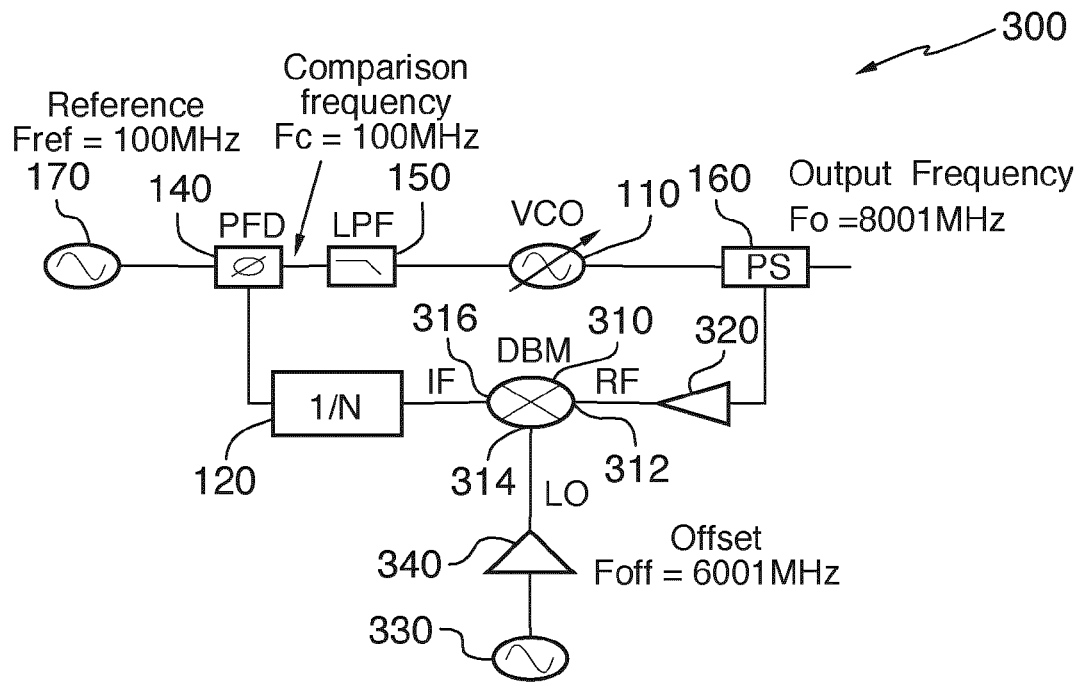
FIG. 8A is a block diagram of a synthesizer operating at an offset from the integer boundary.

In FIG. 8A the output frequency of the offset loop 300 has been increased by 1 MHz, to 8001 MHz. In this case the offset frequency is increased to 6001 MHz to maintain the IF frequency at 2000 MHz so that the output of the frequency divider is 100 MHz. Under this operating mode symmetrical spurs will occur at multiples of +/−1 MHz offset from the carrier frequency at 8000 MHz and 8002 MHz.

Figure 8B:
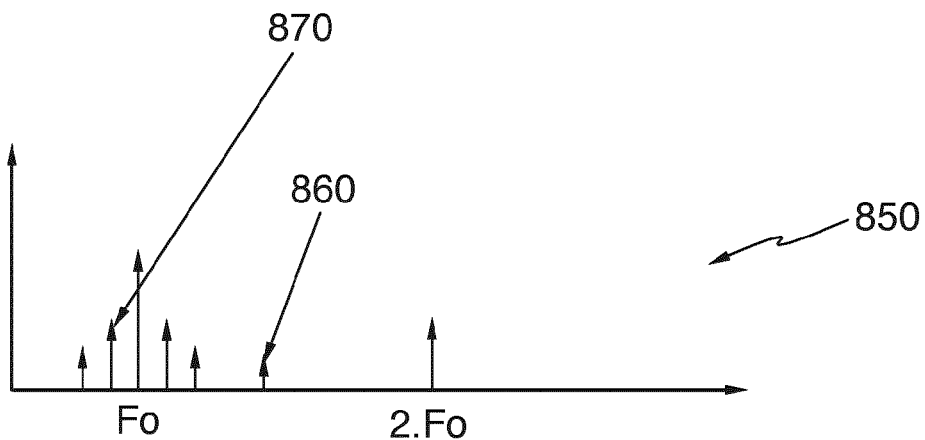
FIG. 8B is a graph of the power spectrum of the output of the synthesizer of FIG. 8A.

As illustrated in graph 850 of FIG. 8B, integer boundary spurs 870 occur at 1 MHz offset and integer multiples of 1 MHz offset from $F_o$. The spurs 870 arise from the mixing products such as three times the offset frequency (18003 MHz) minus twice the output frequency (16002 MHz) which results in a signal at 2001 MHz at the IF port 316 of the mixer 310. The fundamental mixing product is at 2000 MHz, resulting from $F_o - F_{off}$. The mixing products are phase modulation sidebands on the fundamental mixing product. The frequency divider decreases the fundamental mixing product frequency by a factor of 20 to 100 MHz whilst maintaining the phase modulation spurs caused by the higher order mixing products at ±1 MHz offset, resulting in spurs at 99 MHz and 101 MHz. As a result the output of the frequency divider 120 consists of a 100 MHz main tone containing phase modulation sidebands 1 MHz offset from the carrier frequency $F_c$. Graph 850 also illustrates a comparison frequency spur 860. Comparison frequency spur 860 is suppressed by LPF 150.

The PFD 140 compares the frequency divider output with the 100 MHz reference signal to generate a correction voltage to steer the VCO 110. The phase modulation sidebands are also compared with the 100 MHz reference signal and result in a ±1 MHz ripple in the VCO control voltage. If the control voltage ripple falls within the loop filter bandwidth then the VCO is phase modulated resulting in spurious sidebands occurring at 1 MHz offset from the microwave output signal of the synthesizer at 8000 MHz and 8002 MHz.

Figure 9A:
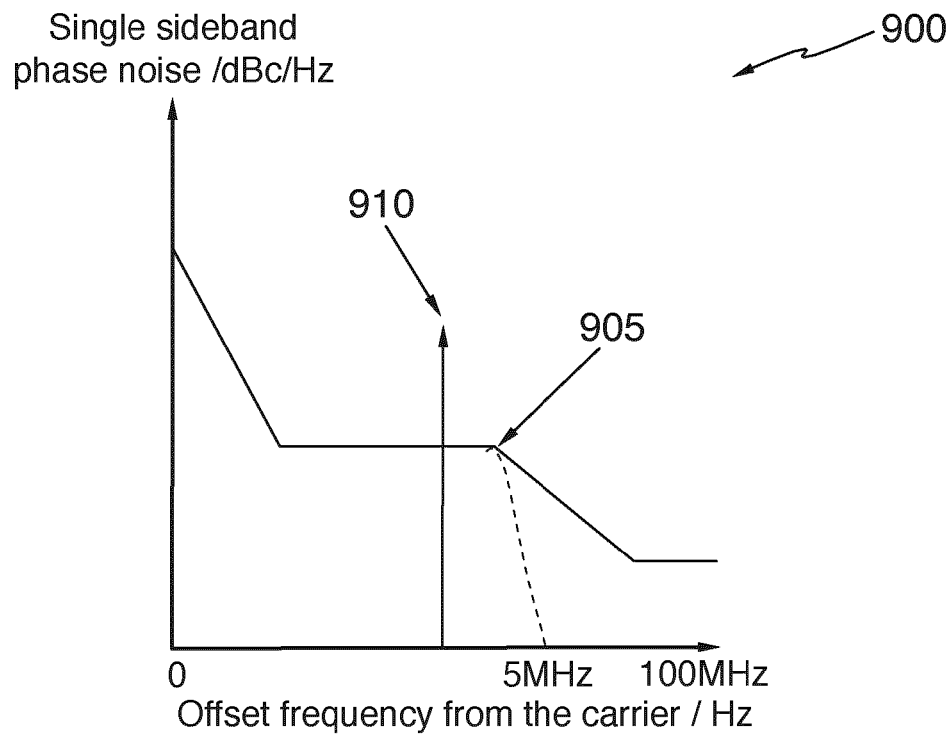
FIG. 9A is a graph illustrating sources of noise within a phase locked loop having a low pass filter with a 5 MHz bandwidth.
Figure 9B:
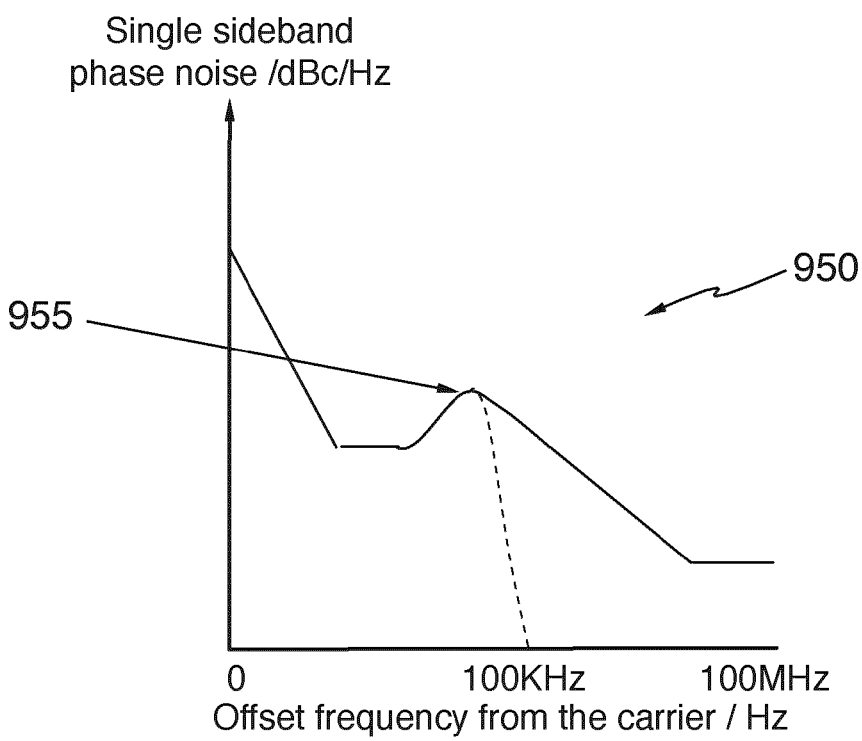
FIG. 9B is a graph illustrating sources of noise within a phase locked loop having a low pass filter with a 100 KHz bandwidth.

Reference is now made to FIGS. 9A and 9B, which are graphs 900 and 950 that illustrate sources of phase noise within a phase locked loop. FIG. 9A illustrates a graph for a phase locked loop that has a low pass filter with a 5 MHz bandwidth. The corner frequency of the loop filter that corresponds to FIG. 9A is indicated at 905. FIG. 9B illustrates a graph for a phase locked loop that has a low pass filter with a 100 KHz bandwidth. The corner frequency of the loop filter that corresponds to FIG. 9B is indicated at 955.

As illustrated in FIG. 9A, a 1 MHz integer boundary spur 910 will pass through a loop filter having a bandwidth of 5 MHz. The spurious signals can be reduced by narrowing the loop filter bandwidth or changing the reference frequency in order to move the spurs further into the stop band of the loop filter. In the case that the loop filter bandwidth is reduced, the phase noise of the resultant synthesizer will increase as more of the VCO phase noise is present in the synthesizer output and within the loop filter bandwidth, as illustrated in FIG. 9B. Accordingly, the use of a loop filter bandwidth of 100 KHz reduces a 1 MHz integer boundary spur by 20 dB at the expense of increase of IBN. Reduction in the loop filter bandwidth is also only a partial solution to reducing the spurious since an application with a smaller frequency step of say 10 KHz will result in a spur that is 10 KHz offset from the carrier and well within the bandwidth of a loop filter optimized to reduce a 1 MHz spur.

If the reference frequency is changed then the frequency offset between the spur and the reference frequency can be increased in order to move the spur frequency further into the stop band of the loop filter. If for example the reference frequency is changed from 100 MHz to 70 MHz and the output frequency is maintained at 8001 MHz then the offset frequency will be 6601 MHz. In this case the spurious tone $3 \times F_{off} - 2 \times F_o$ at the IF output of the mixer will be at 3801 MHz and the fundamental mixing tone will be at 1400 MHz, hence the spur frequency is now 2401 MHz offset from the main tone and as such is readily suppressed by the low pass filter of the loop. The drawback of this approach is that the reference frequency needs to be adjustable which increases the complexity of the frequency synthesizer and also introduces at least one new frequency into the synthesizer which must be controlled with respect to spurious.

In an optimal synthesizer design all frequencies would land on the output frequency or harmonics of the output frequency so any leakage signals do not appear as spurious at the synthesizer output. Reference adjustment of the type described also requires an increase in the component count, power consumption and overall size of the resultant synthesizer.

Various embodiments of the new offset loop architecture, which are the subject of the present disclosure, will now be described in the context of their elimination of the previously mentioned spurious signal limitations. It is important to note that various embodiments of the revised synthesizer architecture ensure all spurious caused by the offset loop mixer fold on top of the comparison frequency and as such there are no constraints placed on the minimum tuning frequency step size or the loop filter beyond that normally observed with a single loop frequency synthesizer.

Figure 10A:
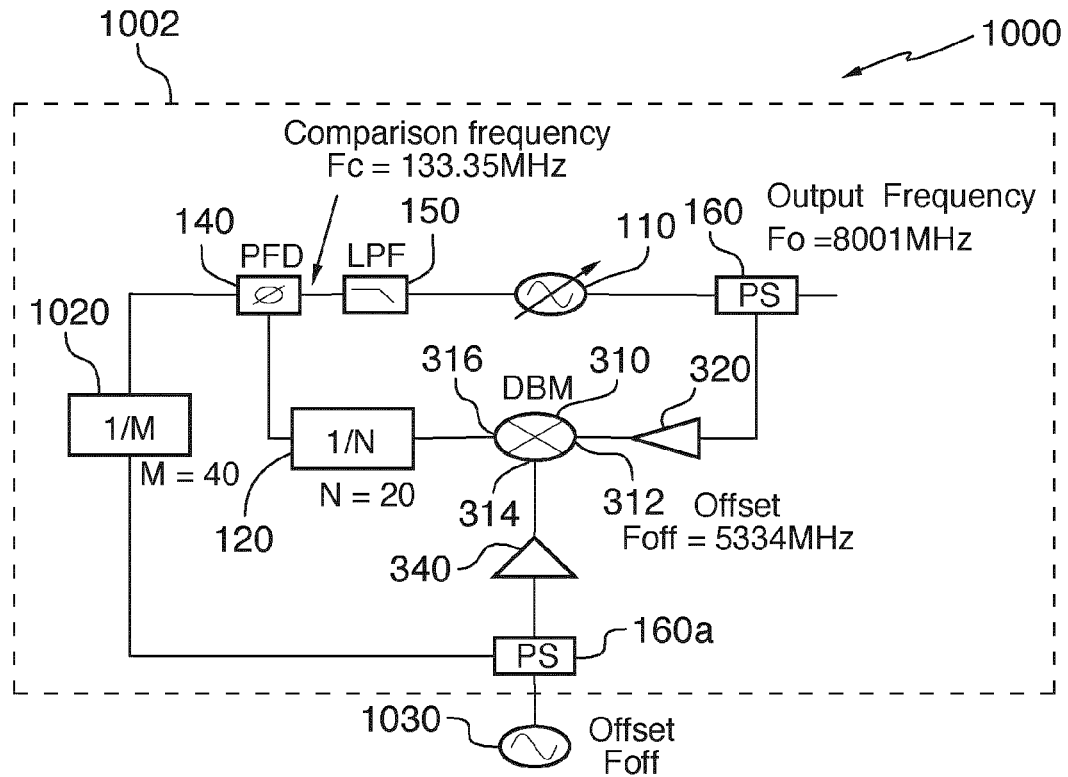
FIG. 10A is a block diagram of a frequency synthesizer, according to various embodiments.

FIG. 10A illustrates a block diagram of a new offset synthesizer system 1000, according to various embodiments. Offset synthesizer system 1000 comprises synthesizer loop 1002 and offset signal generator 1030. A significant difference of embodiments of synthesizer loop 1002 over conventional offset loops, such as synthesizer 300, is that the offset signal applied to the LO port 314 of the feedback path mixer 310 is also applied to a second frequency divider 1020, having an integer division ratio 'M'. It should be noted that, in various embodiments, the RF and LO signals to the mixer 310 can be interchanged provided the drive levels to the mixer are respected. Offset signal generator 1030 generates the offset signal and provides it to the input port of power splitter 160a. In various embodiments, offset signal generator 1030 can be any suitable signal generator. Power splitter 160a outputs the offset signal to divider 1020 and amplifier 340. The output of the 'M' divider 1020 is used in place of the fixed frequency reference that is applied to the PFD 140 in the case of the conventional offset loop design. The frequency fed to the reference port of the PFD 140 has a frequency equal to:

$$F_{ref} = F_{off}/M \quad (1)$$

Where '$F_{ref}$' is the frequency applied to the reference port of the PFD. The offset frequency is applied to the LO port 314 of the mixer 310, consequently the mixer LO frequency can be written in terms of the reference frequency as:

$$F_{LO} = F_{ref}(M) \quad (2)$$

Under locked conditions the feedback path signal applied at the VCO port of the PFD must also equal $F_{off}/M$, which means the mixer IF port signal frequency is $F_{off}(N/M)$. Using equation (1) the mixer IF port 316 frequency can be written in terms of the reference frequency as:

$$F_{IF} = F_{ref}(N) \quad (3)$$

The mixer RF port 312 frequency is equal to the IF port frequency of the mixer plus the offset frequency applied at the LO port of the mixer. The mixer RF frequency is consequently related to the offset and IF port 316 frequencies by the expression:

$$F_{RF} = F_{LO} + F_{IF} = F_{off} + F_{IF} \quad (4)$$

Substitution of equation (1) and (3) into (4) yields:

$$=> F_{RF} = F_{ref}(M+N) \quad (5)$$

Since M and N are integer values then the mixer IF, LO and RF frequencies are all integer multiples of the reference frequency irrespective of the output frequency.

Mixer spurious products occur at the sum and difference frequencies of the LO and RF frequencies. Letting 'p' and 'q' equal integer values related to the mixer spurious order then the mixer spurious at the IF port of the feedback mixer can be expressed as:

$$F_{IF} = F_{RF}(p) \pm F_{LO}(q) \quad (6)$$

Substitution of equations (2) and (5) into (6) yields the following expression for the IF signal in terms of the reference frequency and the associated integer multipliers:

$$F_{IF} = F_{ref}(M+N)(p) \pm F_{ref}(M)(q) \quad (7)$$

Equation (7) shows that no matter what the output frequency selected for the synthesizer is the mixing spurious from the feedback mixer will all fold on top of multiples of the reference frequency. The reference frequency can be selected to be outside the loop filter bandwidth as is normally the case for the single loop phase locked loop so that the loop filter can suppress the reference frequency spurious. No matter how small the frequency step size executed or where the step is within the frequency band of operation all mixing product spurious will fold onto multiples of the reference frequency resulting in a clean output spectrum.

Figure 10B:
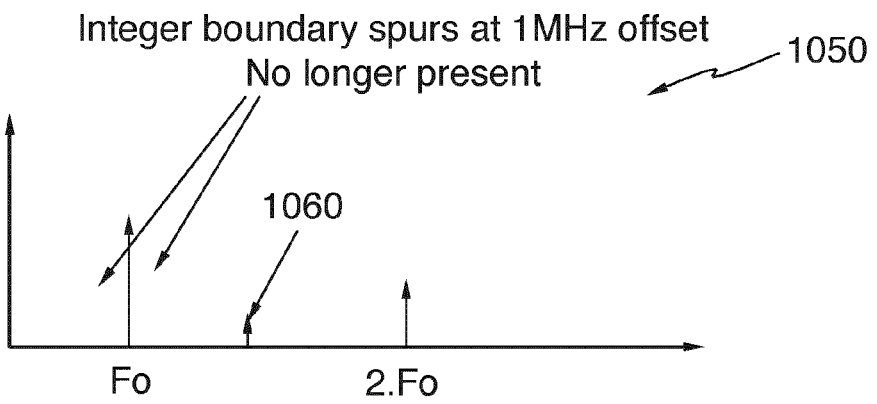
FIG. 10B is a graph of the power spectrum of the output of the synthesizer of FIG. 10A.

This effect can be seen by comparing graph 1050 of FIG. 10B and graph 850 of FIG. 8B. Graph 1050 of FIG. 10B illustrates the power spectrum at the output of the synthesizer of FIG. 10A. Graph 850 of FIG. 8B illustrates the power spectrum at the output of the synthesizer of FIG. 8A. As discussed above, graph 850 illustrates that, for the synthesizer of FIG. 8A, integer boundary spurs 870 occur at integer multiples of 1 MHz offset from $F_o$. In contrast, graph 1050 shows that, for various embodiments of synthesizer loop 1002 of FIG. 10A, integer boundary spurs are not present. Graph 1050 also illustrates a comparison frequency spur 1060. Comparison frequency spur 1060 is suppressed by LPF 150. It should be noted the VCO second harmonic is also shown in 1050 a low pass harmonic filter is typically used to suppress this spur to the level required by the system specification.

The output frequency is readily related to the reference frequency through equation (8), which can then be used to determine the reference frequency based on the synthesizer output frequency requirement.

$$F_o = F_{ref}(M+N) \quad (8)$$

The offset frequency required is then calculated from equation (8), note equation (8) is derived from equations (1) to (6) using the expressions (9) and (10):

$$F_o = F_{RF} \quad (9)$$

$$F_{off} = F_{LO} \quad (10)$$

As discussed above, various embodiments of the synthesizer system disclosed herein utilize any suitable offset generator. In various embodiments, the offset frequency signal of the synthesizer disclosed herein is generated by a second frequency synthesizer loop. The second synthesizer loop can comprise a phase locked loop. The phase locked loop can be of a multiplicity of architectures including but not limited to: integer −N, fractional −N and YIG tuned phase locked oscillators.

Figure 11A:
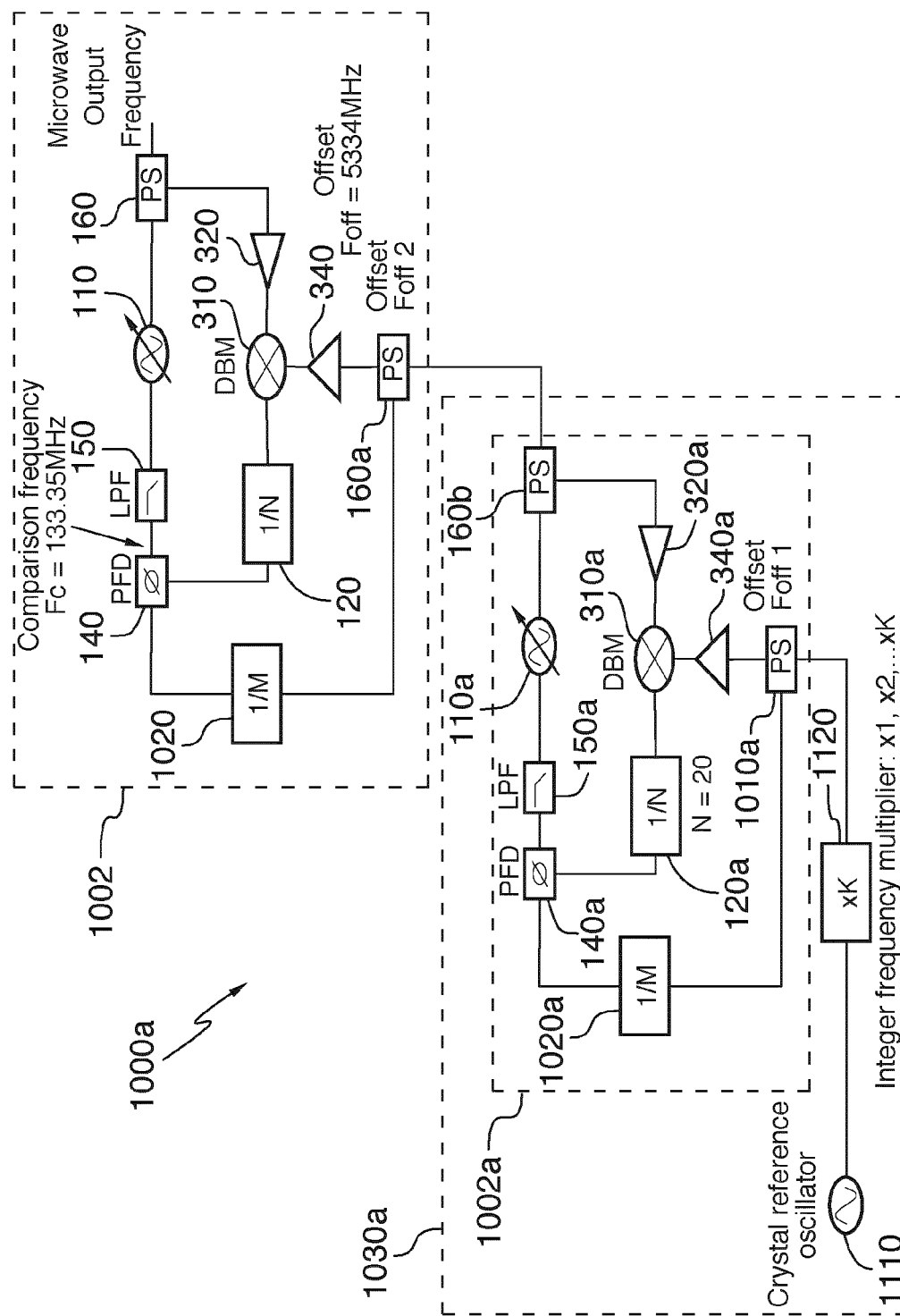
FIGS. 11A to 11F are block diagrams of frequency synthesizers, according to various embodiments.

Reference is now made to FIG. 11A, which is a block diagram illustrating a synthesizer system 1000a, according to various embodiments. System 1000a comprises a synthesizer loop 1002 in accordance with FIG. 10A and an offset signal generator 1030a. The offset generator 1030a comprises a synthesizer loop 1002a, a crystal reference oscillator 1110, and an integer frequency multiplier 1120. Crystal reference oscillator 1110 and integer frequency multiplier 1120 provide a fixed frequency offset. In some embodiments of system 1000a, synthesizer loop 1002a is implemented in the exact same manner as synthesizer 1002.

Figure 11B:
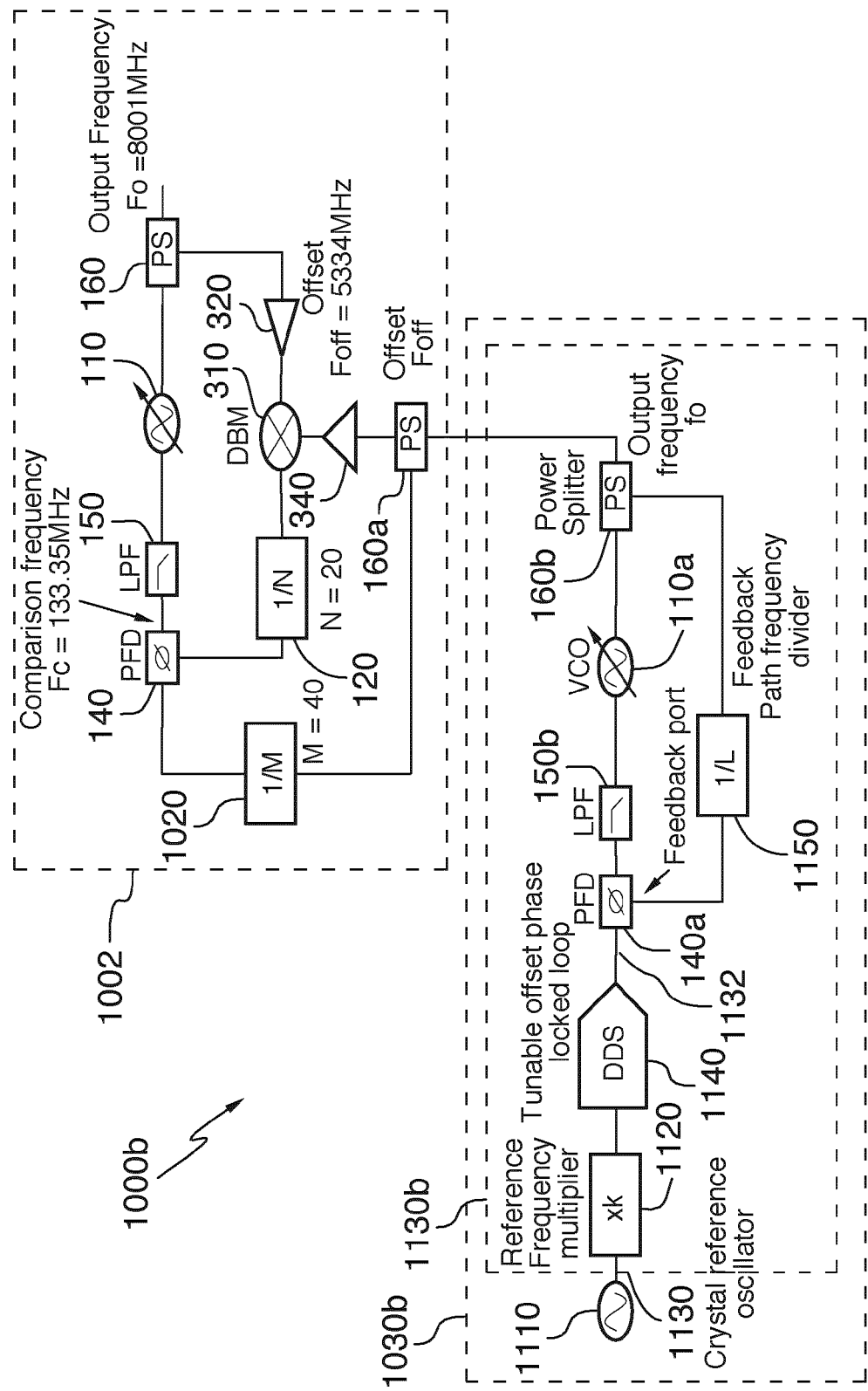
Figure 11C:
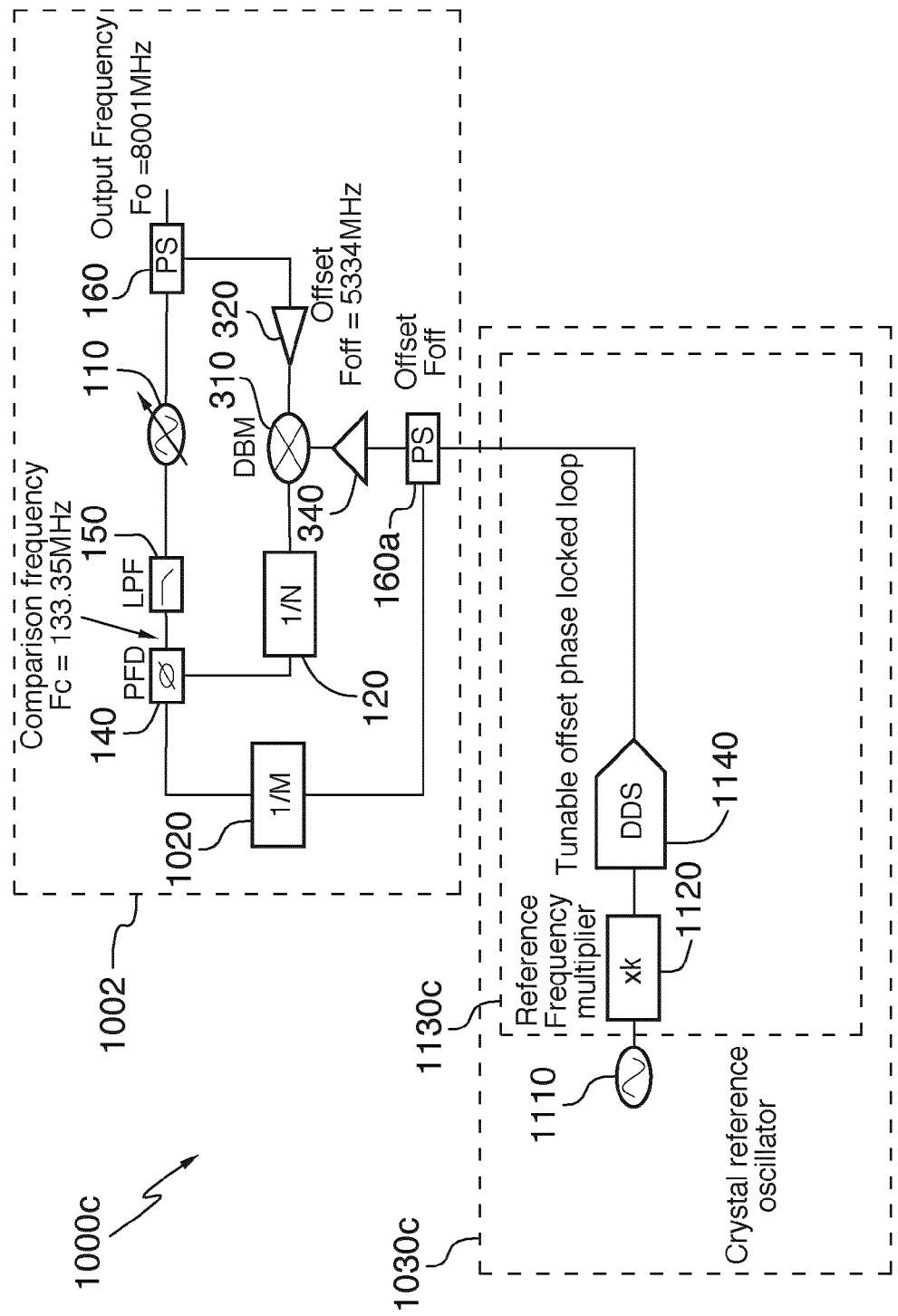

Reference is now made to FIG. 11B, which is a block diagram illustrating a synthesizer system 1000b, according to various embodiments. System 1000b comprises a synthesizer loop 1002 in accordance with FIG. 10A and an offset signal generator 1030b. Offset signal generator 1030b can be referred to as a DDS controlled tunable offset frequency signal generator. Offset signal generator 1030b comprises a crystal reference oscillator 1110 and a synthesizer loop 1130b. The frequency synthesizer loop 1130b shown in FIG. 11B incorporates a direct digital synthesizer (DDS) 1120 at the reference port 1132 to enable fine frequency step size to be achieved whilst maintaining low phase noise. The synthesizer loop 1130b comprises a reference frequency multiplier 1120, a DDS 1140 and a PLL comprising PFD 140a, LPF 150b, VCO 110a, PS 160b, and a feedback path frequency divider 1150.

Figure 11D:
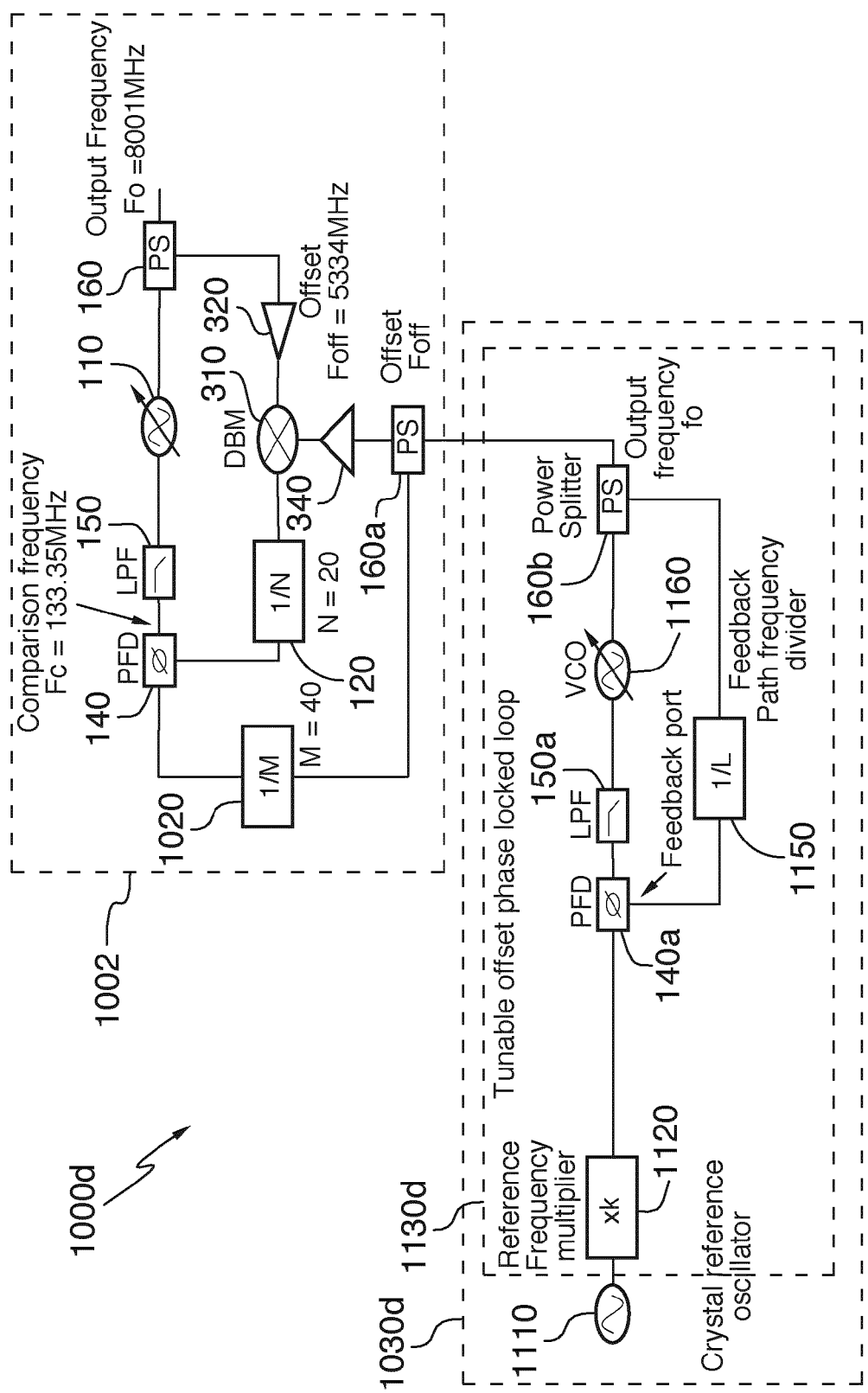

Reference is now made to FIG. 11D, which is a block diagram illustrating a synthesizer system 1000c, according to various embodiments. System 1000c comprises a synthesizer loop 1002 in accordance with FIG. 10A and an offset signal generator 1030c. Offset signal generator 1030c can be referred to as a DDS controlled tunable offset frequency signal generator. Offset signal generator 1030c comprises a crystal reference oscillator 1110 and a digital frequency synthesizer 1130c. The digital frequency synthesizer 1130c comprises a reference frequency multiplier 1120 and a DDS 1140.

Reference is now made to FIG. 11O, which is a block diagram illustrating a synthesizer system 1000d, according to various embodiments. System 1000d comprises a synthesizer loop 1002 in accordance with FIG. 10A and an offset signal generator 1030d. Offset signal generator 1030d can be referred to as a narrowband tunable offset frequency signal generator. Offset signal generator 1030d comprises a crystal reference oscillator 1110 and a synthesizer loop 1130d. The synthesizer loop 1130d comprises a reference frequency multiplier 1120, and a PLL comprising PFD 140a, LPF 150b, Dielectric Resonator Oscillator (DRO) 1160, PS 160b, and a feedback path frequency divider 1150.

Figure 11E:
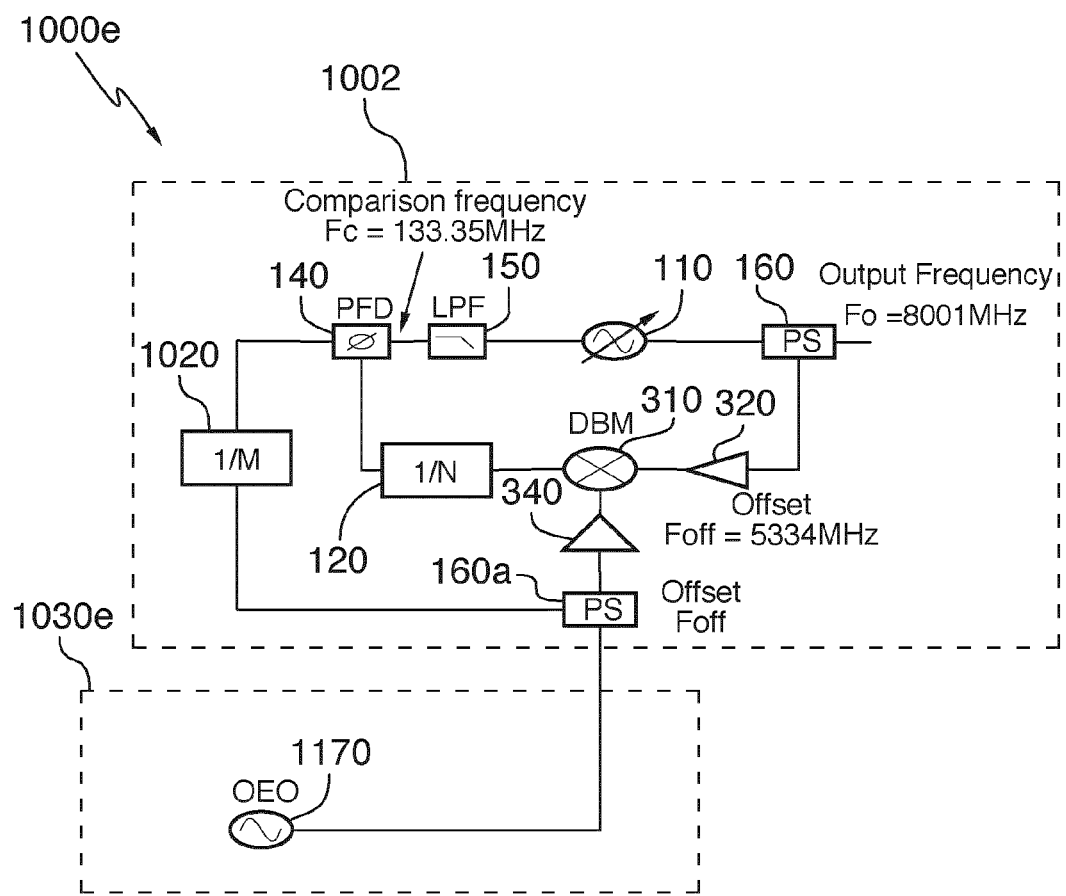

Reference is now made to FIG. 11E, which is a block diagram illustrating a synthesizer system 1000e, according to various embodiments. System 1000e comprises a synthesizer loop 1002 in accordance with FIG. 10A and an offset signal generator 1030e. Offset signal generator 1030e comprises an opto-electronic oscillator 1170. Offset signal generator 1030e can be referred to as a narrowband tunable opto-electronic oscillator frequency offset signal generator.

Figure 11F:
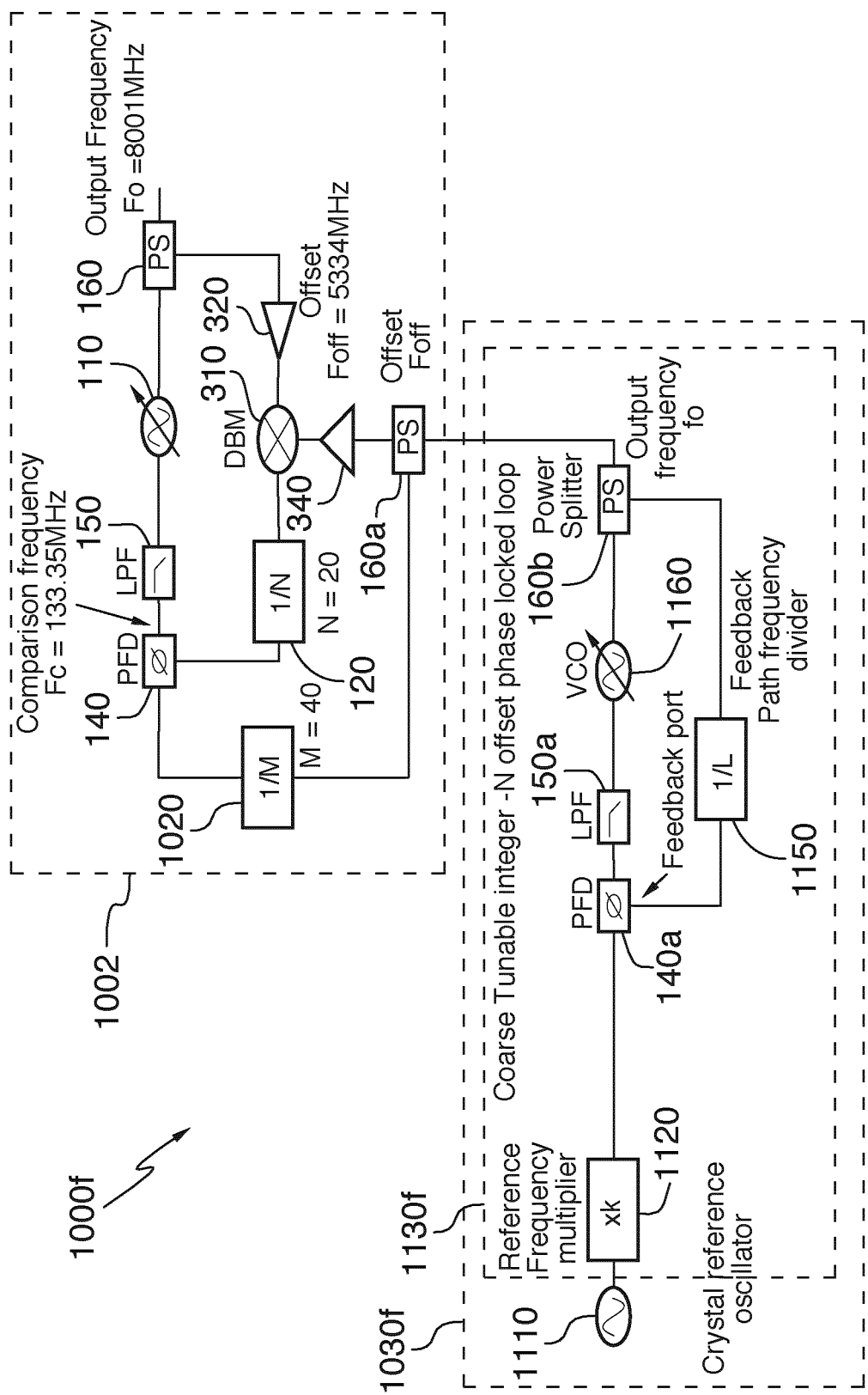

Reference is now made to FIG. 11F, which is a block diagram illustrating a synthesizer system 1000f, according to various embodiments. System 1000f comprises a synthesizer loop 1002 in accordance with FIG. 10A and an offset signal generator 1030f. Offset signal generator 1030f comprises a crystal reference oscillator 1110 and a synthesizer loop 1130f. The synthesizer loop 1130f comprises a reference frequency multiplier 1120, and a PLL comprising PFD 140a, LPF 150b, VCO 110, PS 160b, and a feedback path frequency divider 1150.

Offset signal generator 1030f is a course tuned integer frequency synthesizer. However, fine tuning of output frequency of synthesizer system 1000f is achieved by adjustment of the N and M values of dividers 1020 and 120.

To illustrate the operation of the new synthesizer loop 1002 of FIG. 10A, consider setting M=40, N=20 and $F_o$=8001 MHz then from equation (8) $F_{ref}$=133.35 MHz. The IF frequency is (N)·$F_{ref}$=2,667 MHz and the offset frequency is (M)·$F_{ref}$=5,334 MHz. Considering 3·$F_{off}$−$F_o$=8001 MHz=60×$F_{ref}$. The mixing products are all going to be multiples of the reference frequency and consequently the closest mixing product will be at 133.5 MHz.

No matter how small the required frequency step size the mixing product spurious will fall only at multiples of the reference frequency and as such can be filtered by the low pass filter.

Figure 12A:
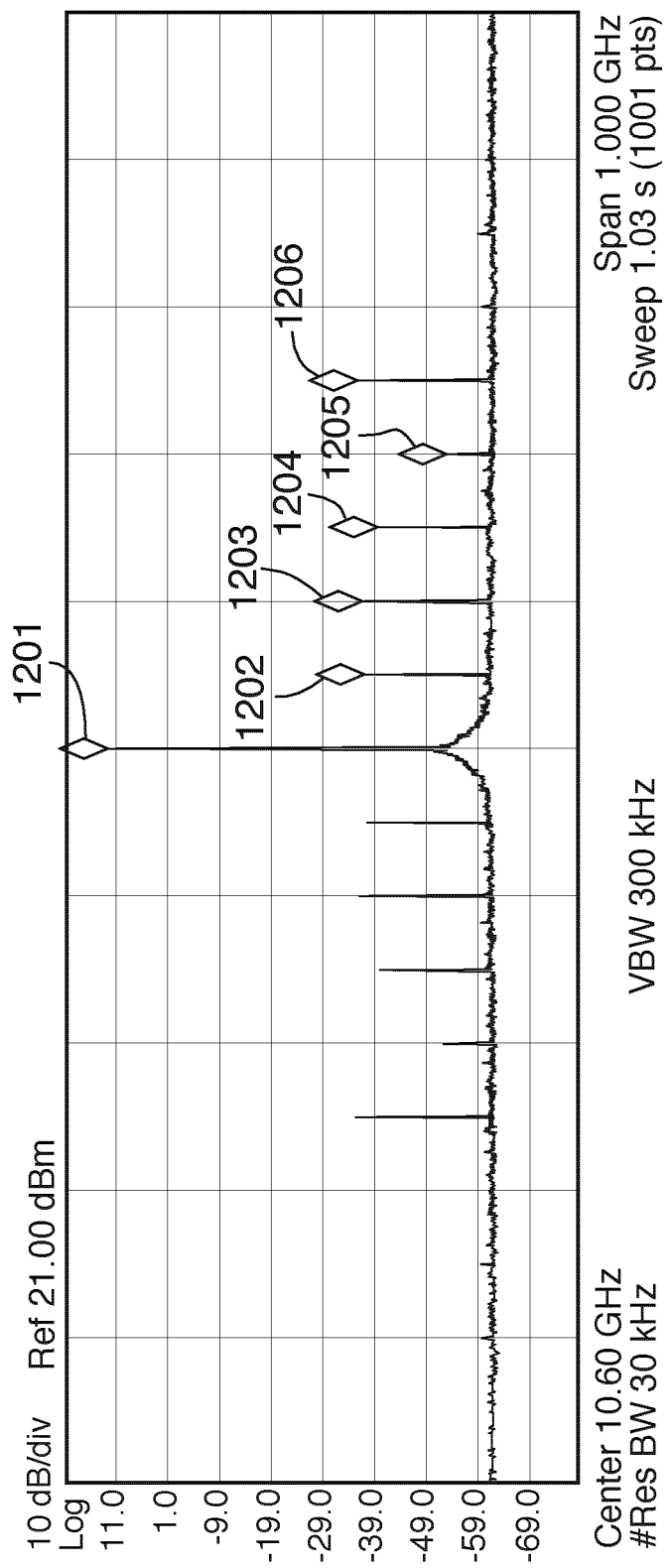
FIG. 12A is a first example of measured spurious content in a conventional offset loop.
Figure 12B:
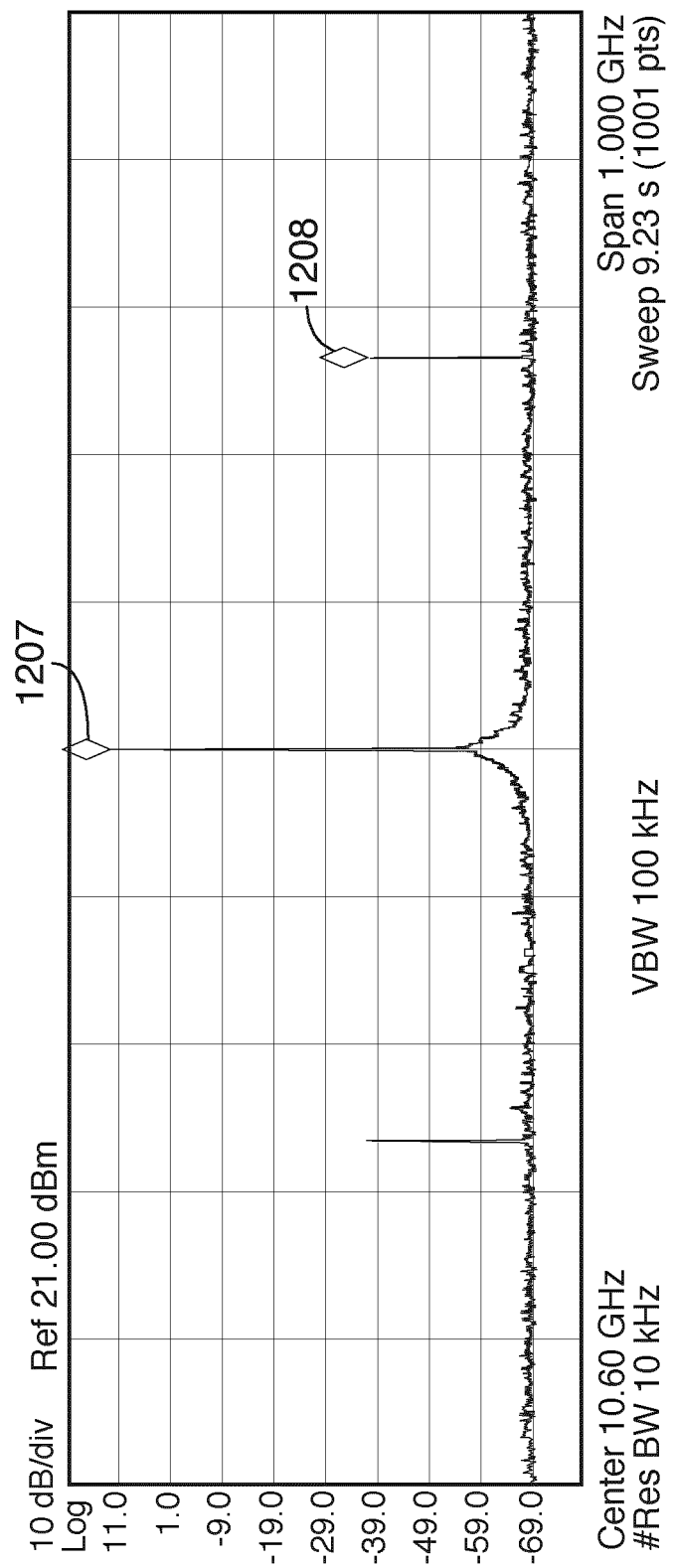
FIG. 12B is a first example of measured signal content in a frequency synthesizer, according to embodiments disclosed herein.
Figure 13A:
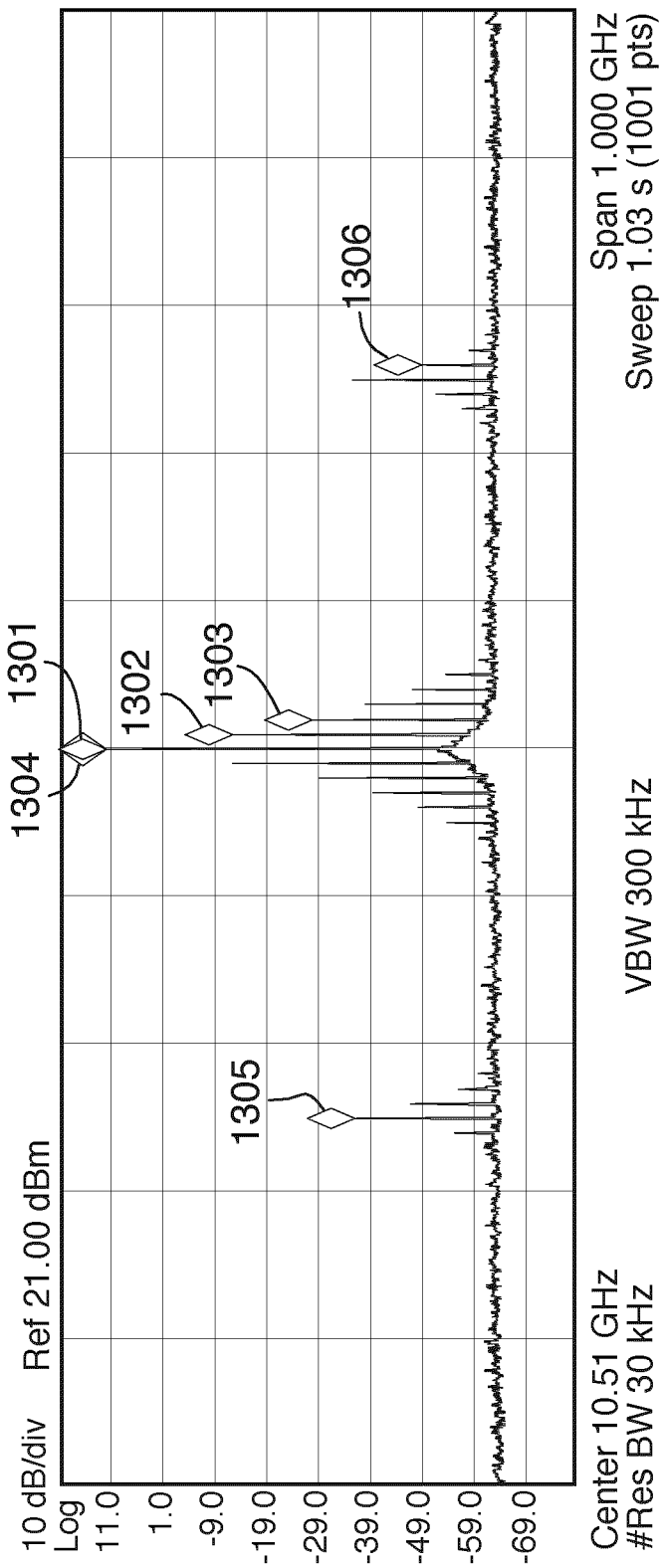
FIG. 13A is a second example of measured spurious content in a conventional offset loop.
Figure 13B:
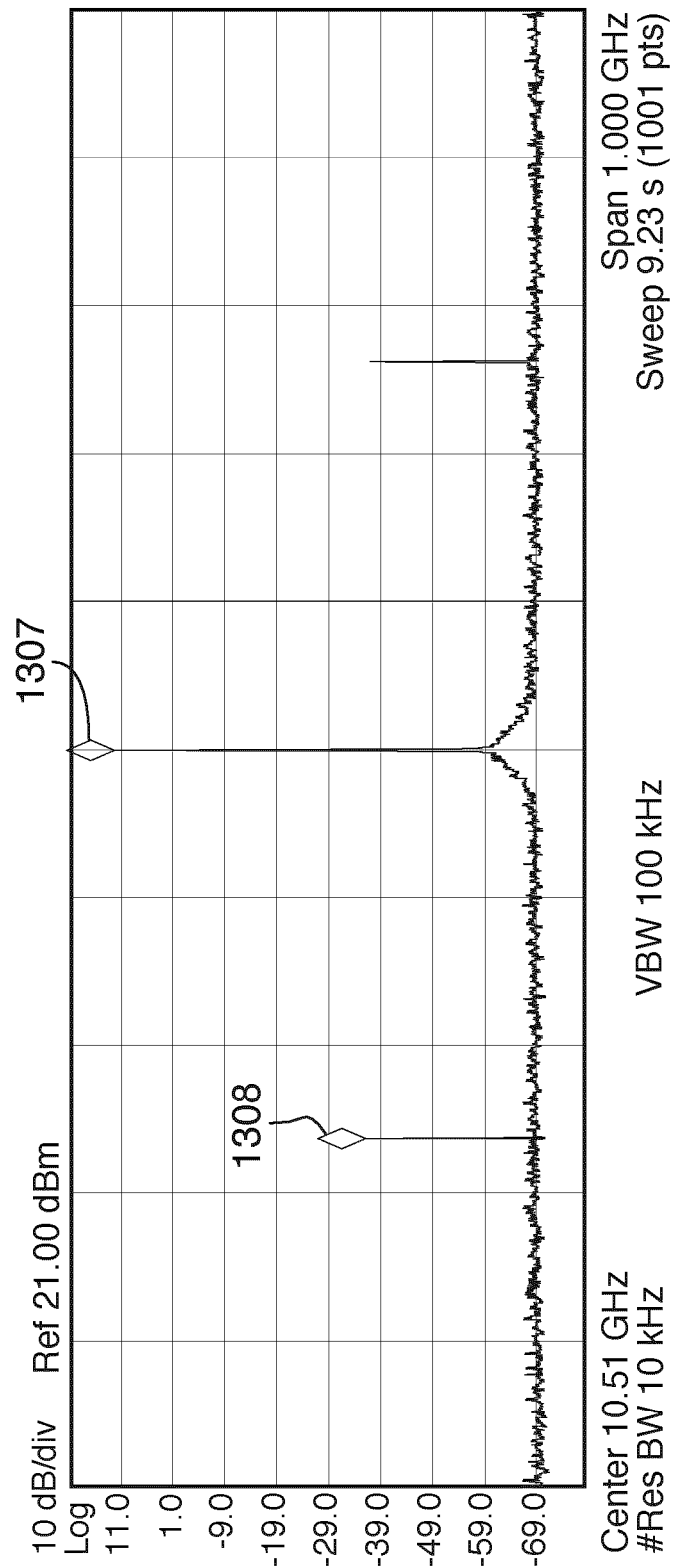
FIG. 13B is a second example of measured signal content in a frequency synthesizer, according to embodiments disclosed herein.

FIGS. 12A, 12B, 13A, and 13B and Tables 1A, 1B, 2A, 2B, 3A, 3B, 4A and 4B show measured results for a conventional offset loop and the new offset loop of FIG. 10. More specifically, 12A and 13A show measured results for the conventional offset loop of FIG. 3 set to different output frequencies, in the case of 12A the output frequency is 10600 MHz and in the case of 13A the output frequency is 10510 MHz. FIGS. 12B and 13B show measured results of the synthesizer loop of FIG. 10A at 10600 MHz and 10510 MHz respectively. Tables 1A and 2A correspond to FIG. 12A. Tables 1B and 2B correspond to FIG. 12B. Tables 3A and 4A correspond to FIG. 13A. Tables 3B and 4B correspond to FIG. 13B.

TABLE 1A

| Parameter | Value |
| --- | --- |
| $F_{off}$ (MHz) | 8100 |
| $F_{ref}$ (MHz) | 250 |
| N | 10 |
| $F_o$ (MHz) | 10600 |
| spur (1202) offset (MHz) | ±50 |
| spur (1203) offset (MHz) | ±100 |
| spur (1204) offset (MHz) | ±150 |
| spur (1205) offset (MHz) | ±200 |
| spur (1206) offset (MHz) | ±250 |

TABLE 1B

| Parameter | Value |
| --- | --- |
| $F_{off}$ (MHz) | 7950 |
| M | 30 |
| $F_{ref}$ (MHz) | 265 |
| N | 10 |
| $F_o$ (MHz) | 10600 |
| spur (1208) offset (MHz) | ±265 |

TABLE 2A

| Marker | X (GHz) | Y (dBM) |
|---|---|---|
| 1201 | 10.600 | 12.776 |
| 1202 | 10.650 | −37.190 |
| 1203 | 10.700 | −36.611 |
| 1204 | 10.750 | −39.843 |
| 1205 | 10.800 | −53.091 |
| 1206 | 10.850 | −35.882 |

TABLE 2B

| Marker | X (GHz) | Y (dBM) |
|---|---|---|
| 1207 | 10.600 | 12.945 |
| 1208 | 10.865 | −37.662 |

TABLE 3A

| Parameter | Value |
|---|---|
| $F_{off}$ (MHz) | 8010 |
| $F_{ref}$ (MHz) | 250 |
| N | 10 |
| $F_o$ (MHz) | 10510 |
| spur (1302) offset (MHz) | ±10 |
| spur (1303) offset (MHz) | ±20 |
| spur (1305) offset (MHz) | ±250 |
| spur (1306) offset (MHz) | ±260 |

TABLE 3B

| Parameter | Value | Comment |
|---|---|---|
| $F_{off}$ (MHz) | 7882.5 | |
| M | 30 | |
| $F_{ref}$ (MHz) | 262.75 | $F_{off}/M$ |
| N | 10 | |
| $F_o$ (MHz) | 10510 | $(M + N) \times F_{ref}$ |
| spur (1308) $F_{off}$ (MHz) | ±262.75 | $(1 \times F_{ref})$ |

TABLE 4A

| Marker | X (GHz) | Y (dBM) |
|---|---|---|
| 1301 | 10.5100 | 12.206 |
| 1302 | 10.5200 | −12.382 |
| 1303 | 10.5300 | −27.799 |
| 1304 | 10.510 | 12.206 |
| 1305 | 10.260 | −35.806 |
| 1306 | 10.770 | −49.150 |

TABLE 4B

| Marker | X (GHz) | Y (dBM) |
|---|---|---|
| 1307 | 10.510 | 12.352 |
| 1308 | 10.247 | −37.080 |

In both cases, the new offset loop only exhibits a spur at the comparison frequency, whereas the conventional offset loop exhibits spurs at multiples of the in band mixing products. In both cases, the operating frequency has been chosen to be close to the integer boundary where the integer boundary spurious limits the performance of the conventional offset loop. In various embodiments, additional suppression of the comparison frequency spur is readily achieved through optimization of the loop filter bandwidth.

Figure 14A:
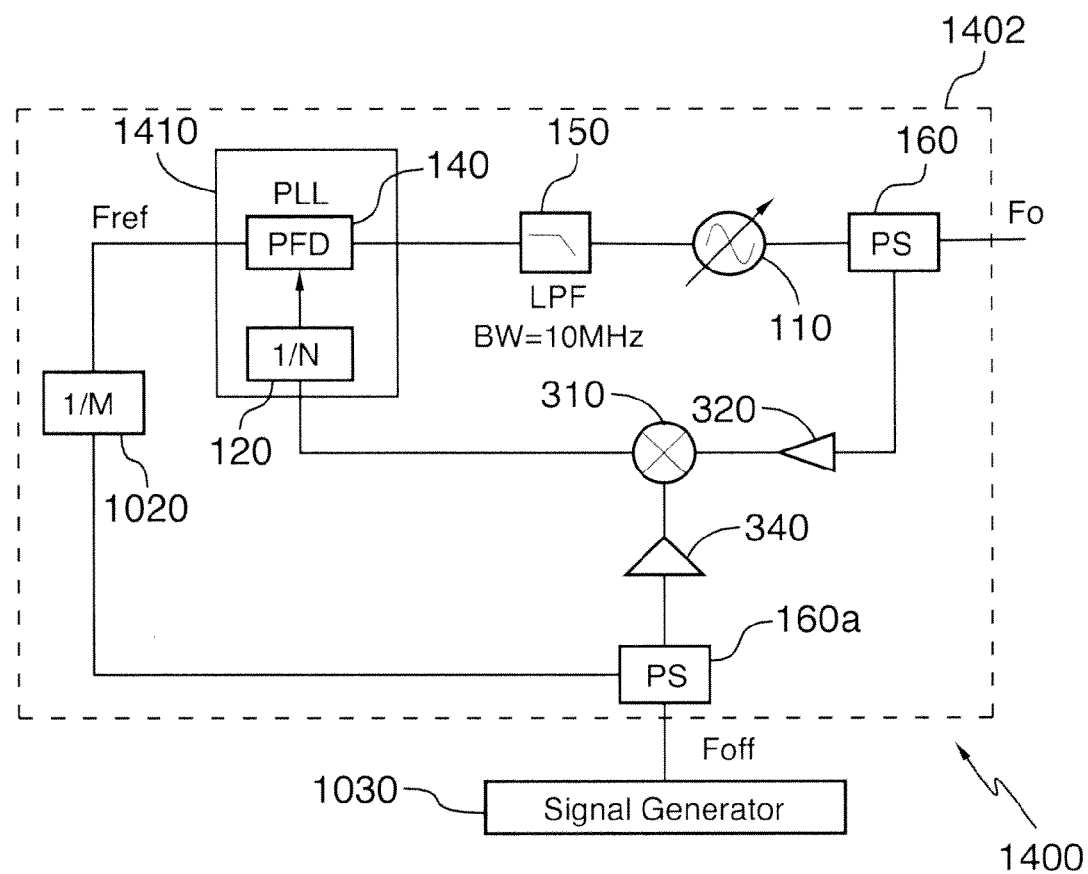
FIG. 14A is a block diagram of a frequency synthesizer, according to various embodiments.

FIG. 14A illustrates a synthesizer system 1400, according to various embodiments. Synthesizer system 1400 differs from synthesizer system 1000 in that PFD 140 and divider 12 are shown as being implemented as part of a PLL integrated circuit 140.

Figure 14B:
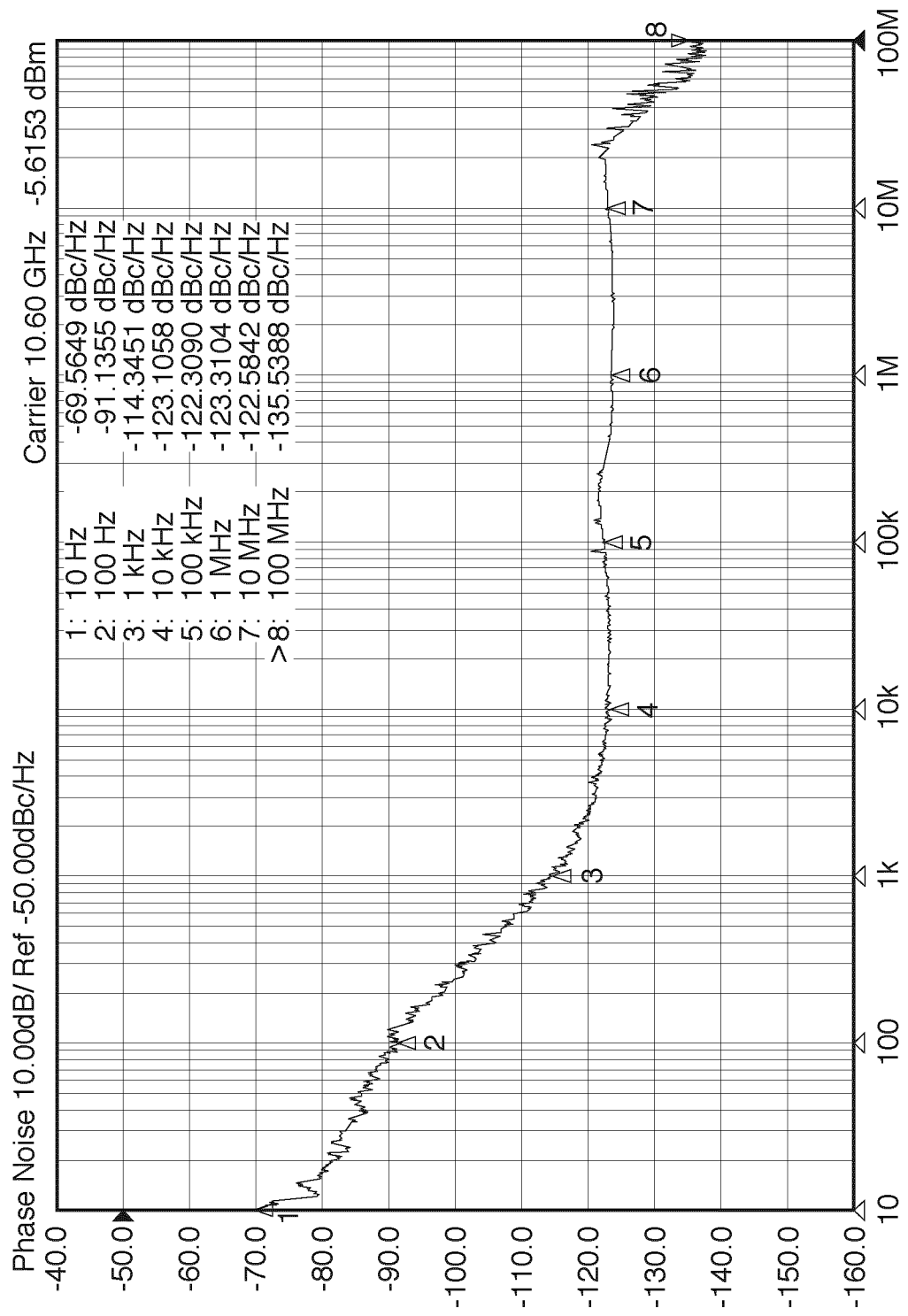
Figure 14C:
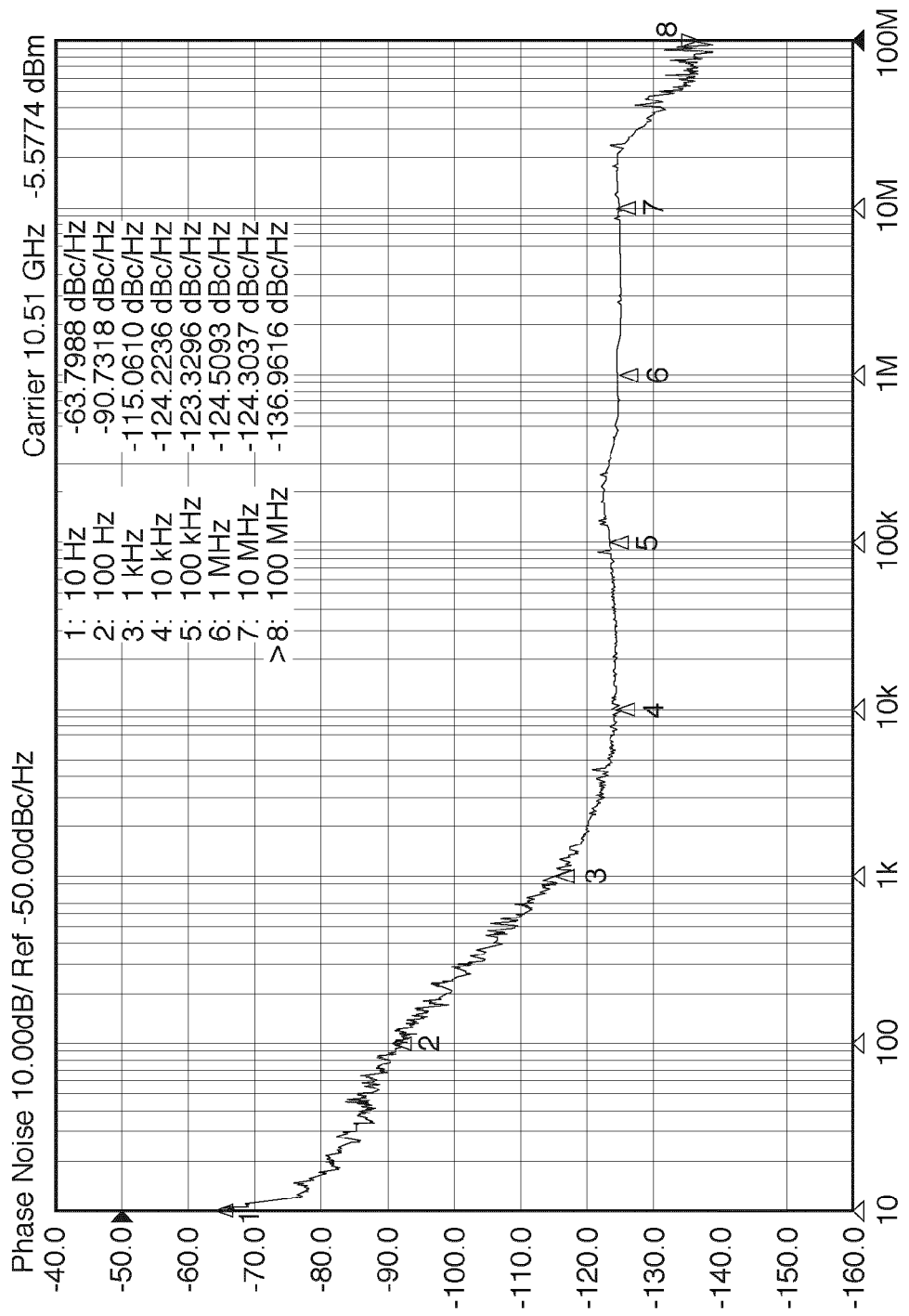

FIGS. 14B, 14C and 14D show the measured phase noise performance for the new offset loop frequency synthesizer at the two output frequencies corresponding to Table 1B and Table 2B and for an output frequency of 12 GHz to demonstrate the effectiveness of the improved synthesizer design with respect to operation at the upper frequency limit of the RADAR X-band. Table 5 shows data for system 1400 of FIGS. 14B, 14C and 14D.

TABLE 5

| $F_{off}$ | $F_o$ | M | N |
|---|---|---|---|
| 7950 MHz | 10600 MHz | 30 | 10 |
| 7882.5 MHz | 10510 MHz | 30 | 10 |
| 9000 MHz | 12000 MHz | 30 | 10 |

In addition to reducing the mixer spurious, various embodiments of the synthesizer also limit the increase in spurious from the offset tuning source. Spurious and phase noise fed in at the offset frequency port of the system will be decrease by 20 $\log_{10}(M)$ in the reference path, then increased by 20 $\log_{10}(N)$ by the feedback path divider. Combining equations (1) and (8) results in the following transfer function of the offset frequency to the output frequency:

$$F_o = F_{off}(1 + N/M) \quad (11)$$

Based on (11) provided M is always greater than or equal to N then the worst case increase in the offset phase noise and spurious will be 20 $\log_{10}(2)$ or 6 dB. The conventional offset phase locked loop scales the reference phase noise by 20 $\log_{10}(N)$, which would in the current case increase the phase noise by 20 $\log_{10}(20)$ or 26 dB. The new synthesizer architecture consequently has phase noise and spurious performance benefits over the conventional offset loop.

Another advantage of the new synthesizer architecture is that the mixing spurious closest to the carrier frequency occurs at the comparison frequency. The loop filter bandwidth can be increased to up to ¹⁄₁₀ of the comparison frequency which is typically 10 MHz whilst still providing adequate suppression of the comparison frequency spurs. The wide loop bandwidth is advantageous with respect to providing low in band phase noise and fast switching time. The switching time can be approximated as ten times the reciprocal of the bandwidth. Hence a 10 MHz loop bandwidth will ensure a nominal frequency switching time of 1 µs.

Various embodiments of the new synthesizer architecture enable fast switching time, low phase noise and low spurious. Consequently some embodiments of the new synthesizer architecture disclosed herein are very applicable to high performance RADAR systems.

A further application of some embodiments of the new synthesizer architecture is its operation as a low spurious fractional synthesizer. Expression (11) shows that the output frequency can be adjusted based on the ratio of N and M. Various embodiments of the new synthesizer configuration ensure that for any selection of N and M mixing spurious fold onto the comparison frequency and its harmonics. By making the offset frequency synthesizer a conventional integer N synthesizer the new offset loop synthesizer enables the frequency steps to be fractional with respect to the offset frequency. Such an architecture is advantageous over conventional fractional –N synthesizer integrated circuits which suffer from high spurious levels at offset frequencies relative to an integer boundary that are within the loop bandwidth of the synthesizer. In this manner, some embodiments of the new synthesizer architecture represent a new form of fractional –N synthesizer that would not have the limitations of the integer boundary spurs created in the conventional fractional –N synthesizer. Such a synthesizer could readily be placed on an integrated circuit and replace incumbent fractional –N synthesizer integrated circuits providing a fractional –N synthesizer that does not suffer from the integer boundary spur issue.

Various embodiments of the new synthesizer are highly advantageous from an implementation standpoint because of the simplicity of the design. All key components could readily be integrated onto an integrated circuit that would supply an off chip loop filter.

Various embodiments of the new synthesizer architecture do not require any special frequency acquisition circuitry and achieve phase lock within the transient time defined by the loop filter bandwidth.

Some embodiments of the new synthesizer architecture will find application in RADAR as the stable local oscillator where high spectral purity, low phase noise and fast frequency switching are required for pulse compression. Some embodiments of the new synthesizer will also find application in radio telecommunication systems as a low phase noise low spurious replacement for incumbent fractional –N synthesizer circuits.

The above-described embodiments are intended to be examples only. Alterations, modifications and variations can be effected to the particular embodiments by those of skill in the art without departing from the scope, which is defined solely by the claims appended hereto.

What is claimed is:

1. An offset phase locked loop synthesizer comprising:
a circuit loop comprising:
   a voltage controlled oscillator (VCO) having a VCO input and a VCO output;
   a mixer having a first mixer input, a second mixer input, and a mixer output, the first mixer input coupled to the output of the VCO;
   a first divider having an input and an output, the input coupled to the mixer output, the first divider being configured to frequency divide a signal received at the first divider input by a first value N; and
   a phase frequency detector having a reference input for receiving a reference signal, a feed-back input for receiving a feed-back signal, and an output, the feed-back input coupled to the output of the first divider; the phase frequency detector configured to provide an output signal at the output based on a difference between the reference signal and the feed-back signal;
a synthesizer output, for providing an output signal, the synthesizer output coupled to the output of the VCO;
a synthesizer input for receiving an offset signal, the synthesizer input coupled to the circuit loop at the second mixer input; and
a second divider having an input coupled to the synthesizer input for receiving the offset signal and an output coupled to the circuit loop at the reference input of the phase frequency detector, the second divider being configured to frequency divide a signal received at the second divider input by a second value M; and wherein a frequency ($F_O$) of the output of the voltage controlled oscillator and a frequency ($F_{REF}$) of the reference signal are related according to:

$$F_{REF} \times (M \pm N) = F_O.$$

2. The offset phase locked loop synthesizer of claim 1, further comprising an offset signal generator for generating the offset signal, an output of the offset signal generator being coupled to the synthesizer input.

3. The offset phase locked loop synthesizer of claim 2, wherein the offset signal generator comprises an adjustable frequency reference.

4. The offset phase locked loop synthesizer of claim 3, wherein the adjustable frequency reference comprises a second offset phase locked loop and wherein the second offset phase locked loop comprises:
a circuit loop comprising:
   a voltage controlled oscillator (VCO) having a VCO input and a VCO output;
   a mixer having a first mixer input, a second mixer input, and a mixer output, the first mixer input coupled to the output of the VCO;
   a first divider having an input and an output, the input coupled to the mixer output, the first divider being configured to frequency divide a signal received at the first divider input by a first value; and
   a phase frequency detector having a reference input for receiving a reference signal, a feed-back input for receiving a feed-back signal, and an output, the feed-back input coupled to the output of the first divider; the phase frequency detector configured to provide an output signal at the output based on a difference between the reference signal and the feed-back signal;
a synthesizer output, for providing an output signal, the synthesizer output coupled to the output of the VCO;
a synthesizer input for receiving an offset signal, the synthesizer input coupled to the circuit loop at the second mixer input; and
a second divider having an input coupled to the synthesizer input for receiving the offset signal and an output coupled to the circuit loop at the reference input of the phase frequency detector, the second divider being configured to frequency divide a signal received at the second divider input by a second value.

5. The offset phase locked loop synthesizer of claim 4, wherein the offset signal generator further comprises a fixed frequency offset circuit coupled to the synthesizer input of the second offset phase locked loop.

6. The offset phase locked loop synthesizer of claim 3, wherein the adjustable frequency reference comprises a frequency adjustable phase locked loop.

7. The offset phase locked loop synthesizer of claim 6, wherein the adjustable frequency reference further comprises a direct digital synthesizer (DDS) for generating a reference frequency signal for the frequency adjustable phase locked loop.

8. The offset phase locked loop synthesizer of claim 3, wherein the adjustable frequency reference comprises a narrowband phase locked microwave source.

9. The offset phase locked loop synthesizer of claim 8, wherein the narrowband phase locked microwave source comprises a dielectric resonator oscillator.

10. The offset phase locked loop synthesizer of claim 8, wherein a frequency of the output signal is adjustable by modification of the first value of the first divider and the second value of the second divider.

11. The offset phase locked loop synthesizer of claim 3, wherein the frequency of the offset signal is adjustable with a step size less than a 3 dB bandwidth of a low pass filter.

12. The offset phase locked loop synthesizer of claim 3, wherein the frequency of the output signal is controlled by changing the frequency of the offset signal.

13. The offset phase locked loop synthesizer of claim 3, wherein the frequency of the output signal is controlled by changing the first value and the second value; and wherein the offset signal is held at a fixed value.

14. The offset phase locked loop synthesizer of claim 1, wherein a frequency of the output signal is adjustable by modification of the first value of the first divider and the second value of the second divider.

15. The offset phase locked loop synthesizer of claim 1, wherein for any reference signal frequency, the frequency of the output of the voltage controlled oscillator and the frequency of the offset signal are simultaneously an integer multiple of a frequency of the reference signal.

16. A method of generating an output signal, the method comprising receiving a reference signal;
mixing the reference signal and the output signal to produce a mixed signal;
frequency dividing the mixed signal by a factor N to produce a first frequency divided signal;
frequency dividing an offset signal by a factor M to produce a second frequency divided signal;
detecting a phase and frequency difference between the first frequency divided signal and the second frequency divided signal;
generating a control signal based on the detected phase and frequency difference; and
generating the output signal based on the control signal, the output signal being an integer multiple of the reference signal; and
wherein a frequency ($F_0$) of the output signal and a frequency ($F_{REF}$) of the reference signal are related according to:

$$F_{REF} \times (M \pm N) = F_0.$$

17. The method of claim 16, wherein generating the control signal comprises:
generating a difference signal, the difference signal being indicative of the detected phase and frequency difference; and
low pass filtering the difference signal.

18. The method of claim 16, wherein generating the output signal comprises applying the control signal to a frequency control port of an output oscillator.

\* \* \* \* \*